United States Patent
Kim et al.

(10) Patent No.: US 10,461,123 B2
(45) Date of Patent: Oct. 29, 2019

(54) LIGHT EMITTING DEVICE AND DISPLAY DEVICE INCLUDING THE SAME

(71) Applicant: Samsung Display Co., Ltd., Yongin-si, Gyeonggi-do (KR)

(72) Inventors: Dae Hyun Kim, Yongin-si (KR); Jong Hyuk Kang, Yongin-si (KR); Joo Yeol Lee, Yongin-si (KR); Hyun Deok Im, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/851,500

(22) Filed: Dec. 21, 2017

(65) Prior Publication Data

US 2018/0175009 A1 Jun. 21, 2018

(30) Foreign Application Priority Data

Dec. 21, 2016 (KR) .......................... 10-2016-0175770

(51) Int. Cl.
*H01L 27/15* (2006.01)
*H01L 33/38* (2010.01)
(Continued)

(52) U.S. Cl.
CPC ........ *H01L 27/156* (2013.01); *H01L 25/0753* (2013.01); *H01L 25/167* (2013.01);
(Continued)

(58) Field of Classification Search
CPC ...... H01L 27/156; H01L 33/20; H01L 33/387
See application file for complete search history.

(56) References Cited

U.S. PATENT DOCUMENTS 8,872,214 B2 10/2014 Negishi et al.
9,112,112 B2 8/2015 Do et al.
(Continued)

FOREIGN PATENT DOCUMENTS

JP 4814394 11/2011
JP 4914929 4/2012
(Continued)

OTHER PUBLICATIONS

Definition of "Through", http://www.dictionary.com (2018) (Year: 2018).*

*Primary Examiner* — Michele Fan
(74) *Attorney, Agent, or Firm* — Lewis Roca Rothgerber Christie LLP

(57) ABSTRACT

A light emitting device, includes: a substrate; a light emitting element on the substrate, the light emitting element having a first end portion and a second end portion arranged in a longitudinal direction; one or more partition walls disposed on the substrate, the one or more partition walls being spaced apart from the light emitting element; a first reflection electrode adjacent the first end portion of the light emitting element; a second reflection electrode adjacent the second end portion of the light emitting element; a first contact electrode connected to the first reflection electrode and the first end portion of the light emitting element; an insulating layer on the first contact electrode, the insulating layer having an opening exposing the second end portion of the light emitting element and the second reflection electrode to the outside; and a second contact electrode on the insulating layer.

20 Claims, 22 Drawing Sheets

(51) Int. Cl.
 *H01L 33/44* (2010.01)
 *H01L 33/20* (2010.01)
 *H01L 27/12* (2006.01)
 *H01L 25/16* (2006.01)
 *H01L 33/60* (2010.01)
 *H01L 29/786* (2006.01)
 *H01L 25/075* (2006.01)
 *H01L 33/40* (2010.01)
 *H01L 33/06* (2010.01)
 *H01L 33/32* (2010.01)
 *H01L 33/62* (2010.01)

(52) U.S. Cl.
 CPC ........ *H01L 27/124* (2013.01); *H01L 27/1255* (2013.01); *H01L 29/78633* (2013.01); *H01L 33/20* (2013.01); *H01L 33/385* (2013.01); *H01L 33/387* (2013.01); *H01L 33/44* (2013.01); *H01L 33/60* (2013.01); *H01L 33/06* (2013.01); *H01L 33/32* (2013.01); *H01L 33/405* (2013.01); *H01L 33/62* (2013.01); *H01L 2933/0016* (2013.01); *H01L 2933/0058* (2013.01); *H01L 2933/0066* (2013.01)

(56) References Cited

U.S. PATENT DOCUMENTS

| | | | |
|---|---|---|---|
| 9,287,242 B2 | 3/2016 | Shibata et al. | |
| 9,329,433 B2 | 5/2016 | Negishi et al. | |
| 9,570,425 B2 | 2/2017 | Do | |
| 2005/0233504 A1* | 10/2005 | Doi | H01L 21/6835 438/127 |
| 2007/0252156 A1* | 11/2007 | Ogihara | B41J 2/45 257/79 |
| 2008/0023716 A1* | 1/2008 | Sagimori | B41J 2/45 257/98 |
| 2009/0315965 A1* | 12/2009 | Yamagata | B41J 2/45 347/130 |
| 2011/0089850 A1 | 4/2011 | Shibata et al. | |
| 2011/0204327 A1* | 8/2011 | Hiruma | H01L 27/153 257/13 |
| 2012/0068153 A1* | 3/2012 | Seong | H01L 33/16 257/13 |
| 2013/0027623 A1* | 1/2013 | Negishi | H01L 25/0753 349/42 |
| 2013/0146903 A1* | 6/2013 | Ichikawa | H01L 33/50 257/88 |
| 2013/0292716 A1* | 11/2013 | Steigerwald | H01L 33/62 257/88 |
| 2016/0027982 A1* | 1/2016 | Sugizaki | H01L 33/44 438/27 |
| 2016/0148911 A1 | 5/2016 | Do | |
| 2016/0254315 A1* | 9/2016 | Furuta | H01L 27/153 257/91 |
| 2016/0307959 A1* | 10/2016 | Zhang | H01L 27/156 |
| 2017/0138549 A1* | 5/2017 | Do | F21K 9/64 |
| 2017/0141279 A1* | 5/2017 | Do | H01L 33/0075 |
| 2017/0170373 A1* | 6/2017 | Peng | H01L 27/124 |
| 2017/0222108 A1* | 8/2017 | Chang | H01L 33/38 |
| 2017/0317228 A1* | 11/2017 | Sung | H01L 33/44 |
| 2017/0338372 A1* | 11/2017 | Teraguchi | H01L 33/0075 |
| 2018/0076360 A1* | 3/2018 | Chae | H01L 27/15 |
| 2018/0108704 A1* | 4/2018 | Jang | H01L 27/153 |
| 2018/0122836 A1* | 5/2018 | Kang | H01L 27/124 |
| 2018/0122837 A1* | 5/2018 | Kang | H01L 27/124 |

FOREIGN PATENT DOCUMENTS

| | | | |
|---|---|---|---|
| KR | 10-1244926 | 3/2013 | |
| KR | 10-1436123 | 11/2014 | |
| KR | 10-1490758 | 2/2015 | |
| WO | WO-2009028895 A2 * | 3/2009 | ........ H01L 33/0095 |

* cited by examiner

LIGHT EMITTING DEVICE AND DISPLAY DEVICE INCLUDING THE SAME

CROSS-REFERENCE TO RELATED APPLICATION

This application claims priority to and the benefit of Korean Patent Application No. 10-2016-0175770, filed on Dec. 21, 2016, in the Korean Intellectual Property Office, the entire content of which is incorporated herein by reference in its entirety.

BACKGROUND

1. Field

The present disclosure relates to a light emitting device, and a display device including the same.

2. Description of the Related Art

A Light Emitting Diode (hereinafter, referred to as an "LED") exhibits comparatively excellent durability in under a poor environment condition, and has excellent performance in terms of life and luminance. Recently, research on an application of the LED to various light emitting devices has been actively conducted.

As a part of the research, a technology for manufacturing a subminiature rod-shaped LED, which is small in the level of micro scale or nano scale, by using a structure, in which an inorganic crystal structure, for example, a nitride-based semiconductor, is grown, has been developed. For example, the rod-shaped LED may be manufactured in a small size with which a pixel of a self-emitting display panel and the like may be formed.

The above information disclosed in this Background section is for enhancement of understanding of the background of the inventice concept, and therefore, it may contain information that does not constitute prior art.

SUMMARY

Aspects of some example embodiments of the present invention include a light emitting device, which is capable of improving light emission efficiency, and a display device including the same.

According to some example embodiments of the present invention, a light emitting device includes: a substrate; a light emitting element on the substrate, the light emitting element having a first end portion and a second end portion arranged in a longitudinal direction; one or more partition walls disposed on the substrate, the one or more partition walls being spaced apart from the light emitting element; a first reflection electrode adjacent the first end portion of the light emitting element; a second reflection electrode adjacent the second end portion of the light emitting element; a first contact electrode connected to the first reflection electrode and the first end portion of the light emitting element; an insulating layer on the first contact electrode, the insulating layer having an opening exposing the second end portion of the light emitting element and the second reflection electrode to the outside; and a second contact electrode on the insulating layer, the second contact electrode being connected to the second reflection electrode and the second end portion of the light emitting element through the opening.

According to some example embodiments, any one of the first and second reflection electrodes is on the partition wall.

According to some example embodiments, the first and second reflection electrodes and the partition wall comprise different materials.

According to some example embodiments, the partition wall includes an insulating material and the first and second reflection electrodes include a conductive material.

According to some example embodiments, when viewed on a plane, the first contact electrode overlaps the first reflection electrode, and the second contact electrode overlaps the second reflection electrode.

According to some example embodiments, the light emitting element is a light emitting diode shaped like a cylinder or a polyprism having a micro scale or a nano scale.

According to some example embodiments, the light emitting element comprises: a first conductive semiconductor layer in which a first conductive dopant is doped; a second conductive semiconductor layer in which a second conductive dopant is doped; and an active layer disposed between the first and second conductive semiconductor layers.

According to some example embodiments, any one of the first and second contact electrodes includes a conductive material, of which a work function is less than 4.1 eV, and the other of the first and second contact electrodes includes a conductive material, of which a work function is larger than 7.5 eV.

According to some example embodiments, each of the first and second reflection electrodes is on the partition wall.

According to some example embodiments, the light emitting device further includes a support member between the substrate and the light emitting element.

According to some example embodiments, the support member includes an insulating material.

According to some example embodiments, the light emitting device further includes an insulating film on an outer circumferential surface of the light emitting element.

According to some example embodiments of the present invention, a display device includes: a substrate including a pixel area; a pixel in the pixel area and having one or more thin film transistors; and a light emitting device on the thin film transistor and connected to the thin film transistor, wherein the light emitting device comprises: a plurality of light emitting elements on the substrate, the plurality of light emitting elements each having a first end portion and a second end portion arranged in a longitudinal direction; one or more partition walls spaced apart from each of the plurality of light emitting elements; a first reflection electrode adjacent the first end portion of each light emitting element; a second reflection electrode adjacent the second end portion of each light emitting element; a first contact electrode connected to the first reflection electrode and the first end portion; an insulating layer on the first contact electrode, and having an opening exposing the second end portion and the second reflection electrode to the outside; and a second contact electrode on the insulating layer and connected to the second reflection electrode and the second end portion through the opening, and any one of the first and second reflection electrodes is connected to the thin film transistor.

According to some example embodiments, any one of the first and second reflection electrodes is on the partition wall.

According to some example embodiments, the first and second reflection electrodes and the partition wall include different materials.

According to some example embodiments, the partition wall includes an insulating material and the first and second reflection electrodes include a conductive material.

According to some example embodiments, when viewed on a plane, the first contact electrode overlaps the first reflection electrode, and the second contact electrode overlaps the second reflection electrode.

According to some example embodiments, each of the plurality of light emitting elements is a light emitting diode shaped like a cylinder or a polyprism having a micro scale or a nano scale.

According to some example embodiments, any one of the first and second contact electrodes includes a conductive material, of which a work function is less than 4.1 eV, and the other of the first and second contact electrodes includes a conductive material, of which a work function is larger than 7.5 eV.

According to some example embodiments, each of the first and second reflection electrodes is on the partition wall.

According to some example embodiments of the present invention, it may be possible to provide the light emitting device, which is capable of improving light emission efficiency.

Further, according to some example embodiments of the present invention, it may be possible to provide the display device including the light emitting device.

BRIEF DESCRIPTION OF THE DRAWINGS

Aspects of some example embodiments of the present invention will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
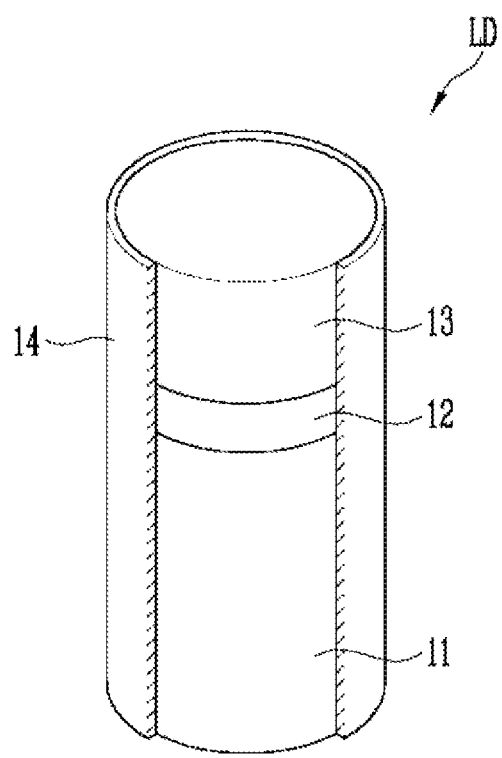
FIG. 1 is a perspective view illustrating a rod-shaped light emitting diode according to some example embodiments of the present invention.

The present disclosure may be variously modified and have various forms, so that some example embodiments will be illustrated in the drawings and described in detail in the text. However it should be understood that the present disclosure is not limited to the specific embodiments, but includes all changes, equivalents, or alternatives which are included in the spirit and technical scope of the present disclosure.

In the description of respective drawings, similar reference numerals designate similar elements. In the accompanying drawings, sizes of structures are illustrated to be enlarged compared to actual sizes for clarity of the present disclosure. Terms "first", "second", and the like may be used for describing various constituent elements, but the constituent elements should not be limited to the terms. The terms are used only to discriminate one constituent element from another constituent element. For example, a first element could be termed a second element, and similarly, a second element could be also termed a first element without departing from the scope of the present disclosure. As used herein, the singular forms are intended to include the plural forms as well, unless the context clearly indicates otherwise.

In the present disclosure, it should be understood that terms "include" or "have" indicates that a feature, a number, a step, an operation, a component, a part or the combination those of described in the specification is present, but do not exclude a possibility of presence or addition of one or more other features, numbers, steps, operations, components, parts or combinations, in advance. It will be understood that when an element such as a layer, film, region, or substrate is referred to as being "on" another element, it can be directly on the other element or intervening elements may also be present. Further, in the present disclosure, when a part of a layer, a film, an area, a plate, and the like is formed on another part, a direction, in which the part is formed, is not limited only to an up direction, and includes a lateral direction or a down direction. On the contrary, it will be understood that when an element such as a layer, film, region, or substrate is referred to as being "beneath" another element, it can be directly beneath the other element or intervening elements may also be present.

Hereinafter, a light emitting device according to some example embodiments of the present invention will be described with reference to the example embodiments of the present disclosure and relevant drawings.

FIG. 1 is a perspective view illustrating a rod-shaped light emitting diode according to some example embodiments of the present invention. In FIG. 1, a cylindrical and rod-shaped light emitting diode (LED) LD is illustrated, but the present disclosure is not limited thereto.

Referring to FIG. 1, the rod-shaped LED LD according to some example embodiments of the present invention may include first and second conductive semiconductor layers 11 and 13, and an active layer 12 interposed between the first and second conductive semiconductor layers 11 and 13. For example, the rod-shaped LED LD may be implemented with a laminated structure, in which the first conductive semiconductor layer 11, the active layer 12, and the second conductive semiconductor layer 13 are sequentially laminated.

According to some example embodiments of the present invention, the rod-shaped LED LD may be provided in a rod shape extended in a direction (e.g., a predetermined direction). When it is assumed that an extension direction of the rod-shaped LED LD is a longitudinal direction, the rod-shaped LED LD may have a first end portion and a second end portion in the extension direction. In some example embodiments of the present invention, one of the first and second conductive semiconductor layers 11 and 13 may be disposed at the first end portion, and the other of the first and second conductive semiconductor layers 11 and 13 may be disposed at the second end portion.

In some example embodiments of the present invention, in FIG. 1, the rod-shaped LED LD may be provided in a cylindrical shape. However, the "rod shape" may include a rod-like or bar-like shape, such as a cylinder and a polyprism, which is elongated in the longitudinal direction (that is, an aspect ratio is larger than 1). For example, a length of the rod-shaped LED LD may be larger than a diameter of the rod-shaped LED LD.

The rod-shaped LED LD may be manufactured to be small to have a diameter and/or a length in a level of, for example, a micro scale or a nano scale. However, the size of the rod-shaped LED LD according to some example embodiments of the present invention is not limited thereto, and the size of the rod-shaped LED LD may also be changed so as to accord with a characteristic or requirement condition of a light emitting device, to which the rod-shaped LED LD is applied.

The first conductive semiconductor layer 11 may include, for example, at least one n-type semiconductor layer. For example, the first conductive semiconductor layer 11 may include any one semiconductor material among InAlGaN, GaN, AlGaN, InGaN, AlN, and InN, and may include a semiconductor layer, in which a first conductive dopant, such as Si, Ge, and Sn, is doped. The material of the first conductive semiconductor layer 11 is not limited thereto, and the first conductive semiconductor layer 11 may be formed of various materials, other than the aforementioned materials.

The active layer 12 may be formed on the first conductive semiconductor layer 11, and may be formed in a single or multiple quantum well structure. According to some example embodiments of the present invention, a clad layer, in which a conductive dopant is doped, may also be formed in an upper portion and/or a lower portion of the active layer 12. For example, the clad layer may be implemented with an AlGaN layer or an InAlGaN layer. In addition, a material, such as AlGaN and AlInGaN, may be used as the active layer 12. When an electric field having a voltage (e.g., a predetermined voltage) or more is applied to the rod-shaped LED LD, a pair of electron and hole is combined in the active layer 12, so that the rod-shaped LED LD emits light.

The second conductive semiconductor layer 13 may be disposed on the active layer 12, and may include a semiconductor layer having a different type from that of the first conductive semiconductor layer 11. For example, the second conductive semiconductor layer 13 may include at least one p-type semiconductor layer. For example, the second conductive semiconductor layer 13 may include any one semiconductor material among InAlGaN, GaN, AlGaN, InGaN, AlN, and InN, and may include a semiconductor layer, in which a second conductive dopant, such as Mg, is doped. The material of the second conductive semiconductor layer 13 is not limited thereto, and the second conductive semiconductor layer 13 may be formed of various materials, other than the aforementioned material.

According to some example embodiments of the present invention, the rod-shaped LED LD may further include another fluorescent layer, active layer, semiconductor layer, and/or electrode layer in an upper portion and/or a lower portion of each layer, in addition to the aforementioned first conductive semiconductor layer 11, active layer 12, and second conductive semiconductor layer 13. Further, the rod-shaped LED LD may further include an insulating film 14. However, according to some example embodiments of the present invention, the insulating film 14 may also be omitted, and may also be provided so as to cover a part of the first conductive semiconductor layer 11, the active layer 12, and the second conductive semiconductor layer 13. For example, the insulating film 14 is provided to a portion, except for both ends of the rod-shaped LED LD, so that both ends of the rod-shaped LED LD may also be exposed.

For convenience of the description, FIG. 1 illustrates the state where a part of the insulating film 14 is removed, and a lateral surface of the cylinder of the rod-shaped LED LD may be completely surrounded by the insulating film 14.

The insulating film 14 may be provided so as to surround at least a part of an outer peripheral surface of the first conductive semiconductor layer 11, the active layer 12, and/or the second conductive semiconductor layer 13. For example, the insulating film 14 may be provided so as to surround at least an outer peripheral surface of the active layer 12. According to some example embodiments of the present invention, the insulating film 14 may include a transparent insulating material. For example, the insulating film 14 may include one or more insulating materials selected from the group consisting of $SiO_2$, $Si_3N_4$, $Al_2O_3$, and $TiO_2$, but is not limited thereto, and various materials having an insulating property may be used.

In some example embodiments of the present invention, the insulating film 14 itself may be formed of a hydrophobic material, or a hydrophobic film formed of a hydrophobic material may also be further provided onto the insulating film 14. The hydrophobic material may be a material containing fluorine exhibiting hydrophobicity. The hydrophobic material may be applied to the rod-shaped LED LD in a form of a Self-Assembled Monolayer (SAM), and in this case, may include octadecyltrichlorosilane, fluoroalkyltrichlorosilane, and perfluoroalkyltriethoxysilane. Further, the hydrophobic material may be a commercialized fluorine contained material, such as Teflon™ or Cytop™, or a material corresponding to the commercialized fluorine contained material.

When the insulating film 14 is provided to the rod-shaped LED LD, the active layer 12 may be prevented from being short-circuited with a first and/or second electrode. Further, the insulating film 14 is formed, so that it is possible to minimize a defect of a surface of the rod-shaped LED LD, thereby improving life and efficiency of the rod-shaped LED LD. Further, when the plurality of rod-shaped LEDs LDs is closely disposed, the insulating film 14 may prevent an undesired short generable between the rod-shaped LEDs LDs.

The rod-shaped LED LD may be used as light emitting sources of various light emitting devices. For example, the rod-shaped LED LD may be used as a light device or a self-emitting display device.

Figure 2:
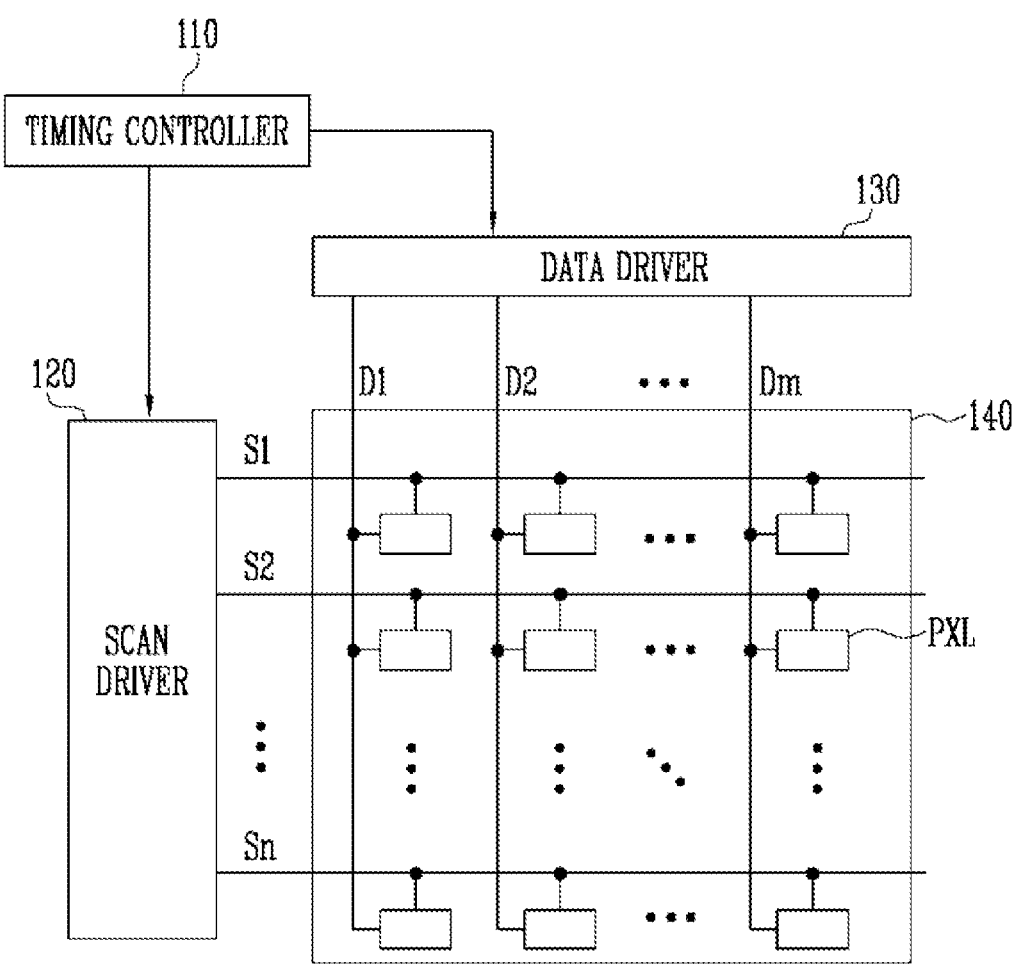
FIG. 2 is a diagram illustrating a light emitting device according to some example embodiments of the present invention.

FIG. 2 is a diagram illustrating a light emitting device according to some example embodiments of the present invention. According to some example embodiments of the present invention, FIG. 2 illustrates a light emitting display device as an example of a light emitting device using the rod-shape LED LD, but the light emitting device according to the present disclosure is not limited to the light emitting display device. As one example, the light emitting device may also be another form of light emitting device, such as a light device.

Referring to FIG. 2, the light emitting device according to some example embodiments of the present invention may include a timing controller 110, a scan driver 120, a data driver 130, and a light emitting unit 140. Like the present example embodiment, when the light emitting device is the light emitting display device, the light emitting unit 140 may mean an entirety of a pixel area implemented on a display panel.

The timing controller 110 may receive various control signals and image data required for driving the light emitting unit 140 from the outside (for example, a system transmitting image data). The timing controller 110 realigns the received image data and transmits the realigned image data to the data driver 130. Further, the timing controller 110 generates scan control signals and data control signals required for driving the scan driver 120 and the data driver 130, and transmits the generated scan control signals and data control signals to the scan driver 120 and the data driver 130, respectively.

The scan driver 120 receives the scan control signal from the timing controller 110 and generates a scan signal in response to the received scan control signal. The scan signal generated by the scan driver 120 may be supplied to unit emission areas EMA (for example, a pixel area, in which a pixel is provided) through scan lines S1 to Sn.

The data driver 130 may receive the data control signal and the image data from the timing controller 110, and generate a data signal in response to the received data control signal and image data. The data signal generated by the data driver 130 may be output to data signals D1 to Dm. The data signal output to the data lines D1 to Dm may be input to the unit emission areas EMA of a horizontal pixel line selected by the scan signal.

The light emitting unit 140 may include the plurality of unit emission areas EMA connected to the scan lines S1 and Sn and the data line D1 to Dm. In some example embodiments of the present invention, the unit emission areas EMA may mean individual pixels.

Each of the unit emission areas EMA may include one or more rod-shaped LEDs LDs as illustrated in FIG. 1. As an example, each of the unit emission areas EMA may include one or more first color rod-shaped LEDs LDs, one or more second color rod-shaped LEDs LDs, and/or one or more third rod-shaped LEDs LDs. The unit emission areas EMA selectively emit light in response to the data signal input from the data lines D1 to Dm when the scan signal is supplied from the scan lines S1 to Sn. For example, each of the unit emission areas EMA emits light with luminance corresponding to the received data signal during each frame period. The unit emission area EMA receiving the data signal corresponding to black luminance does not emit light during the corresponding frame period to display black. In the meantime, when the light emitting unit 140 is a pixel unit of an active light emitting display panel, the light emitting unit 140 may further receive first and second pixel power source, in addition to the scan signal and the data signal, and may be driven.

FIGS. 3A to 3E are circuit diagrams illustrating unit emission areas of the light emitting device according to some example embodiments of the present invention, and particularly, are circuit diagrams illustrating examples of pixels forming a passive light emitting display panel. In FIGS. 3A to 3E, the unit emission area may include a $j^{th}$ pixel (j is a natural number) in an $i^{th}$ horizontal pixel line (i is a natural number). As a non-limiting example related to the pixel illustrated in FIGS. 3A to 3E, the pixel may be one of a red pixel, a green pixel, a blue pixel, and a white pixel.

Figure 3A:
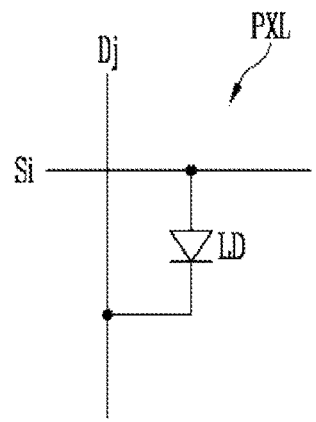
FIGS. 3A to 3E are circuit diagrams illustrating unit emission areas of the light emitting device according to some example embodiments of the present invention, and particularly, are circuit diagrams illustrating examples of pixels forming a passive light emitting display panel.

Referring to FIG. 3A, a pixel PXL includes a rod-shaped LED LD connected between a scan line Si and a data line Dj. According to some example embodiments of the present invention, a first electrode (for example, an anode electrode of the rod-shaped LED LD may be connected to the scan line Si, and a second electrode (for example, a cathode electrode of the rod-shaped LED LD may be connected to the data line Sj. When a voltage equal to or larger than a threshold voltage is applied between the first electrode and the second electrode, the rod-shaped LED LD emits light with luminance corresponding to a size of the applied voltage. That is, the emission of the pixel PXL may be controlled by adjusting voltages of a scan signal applied to the scan line Si and/or a data signal applied to the data line Dj.

Figure 3B:
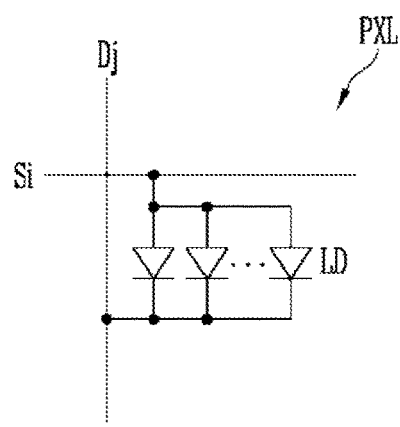

Referring to FIG. 3B, according to some example embodiments of the present invention, a pixel PXL may include two or more rod-shaped LEDs LDs connected in parallel. In this case, luminance of the pixel PXL may correspond to a sum of brightness of the plurality of rod-shaped LEDs LDs. As described above, when the pixel PXL includes the plurality of rod-shaped LEDs LDs, particularly, the large number of rod-shaped LEDs LDs, even though some of the rod-shaped LEDs LDs have defects, it is possible to prevent the defects from causing a defect of the pixel itself.

Figure 3C:
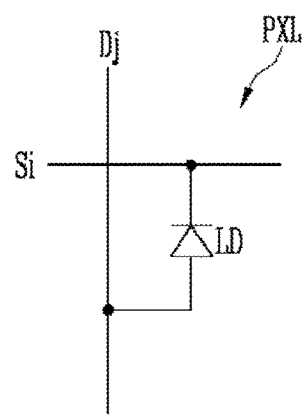

Referring to FIG. 3C, according to some example embodiments of the present invention, a connection direction of a rod-shaped LED LD provided in a pixel PXL may be changed. For example, a first electrode (anode electrode) of the rod-shaped LED LD may be connected to a data line Dj and a second electrode (cathode electrode) of the rod-shaped LED LD may be connected to a scan line Si. In the example embodiment of FIG. 3A and the example embodiment of FIG. 3C, directions, in which the voltages are applied between the scan lines Si and the data lines Dj, may be opposite to each other.

Figure 3D:
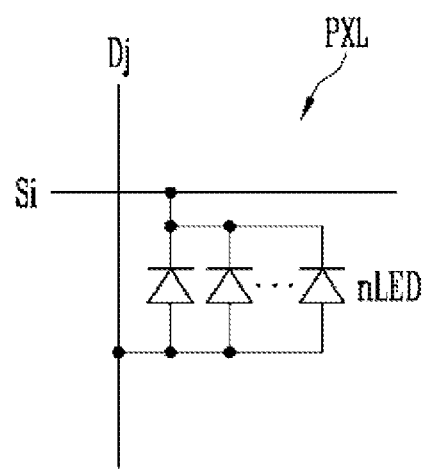

Referring to FIG. 3D, according to some example embodiments of the present invention, the pixel PXL according to the example embodiment of FIG. 3C may also include two or more rod-shaped LEDs LDs connected in parallel.

Figure 3E:
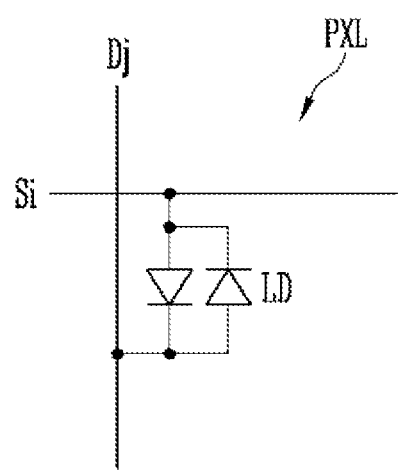

Referring to FIG. 3E, according to some example embodiments of the present invention, a pixel PXL may include a plurality of rod-shaped LEDs LDs connected in different directions. As one example, the pixel PXL may include at least one rod-shaped LED LD, of which a first electrode (anode electrode) is connected to a scan line Si and a second electrode (cathode electrode) is connected to a data line Dj, and at least one rod-shaped LED LD, of which the first electrode (anode electrode) is connected to the data line Dj and the second electrode (cathode electrode) is connected to the scan line Si.

According to some example embodiments of the present invention, the pixel PXL may be direct-current driven or alternating-current driven. When the pixel PXL in FIG. 3E is alternating-current driven, the rod-shaped LEDs LDs connected in a forward direction may emit light, and the rod-shaped LEDs LDs connected in a reverse direction may not emit light. In the meantime, when the pixel PXL in FIG. 3E is direct-current driven, the rod-shaped LEDs LDs, which are connected in the forward direction according to a direction of applied voltage, emit light. That is, during the alternating-current driving, the rod-shaped LEDs LDs included in the pixel PXL of FIG. 3E may alternately emit light according to a voltage direction.

Figure 4A:
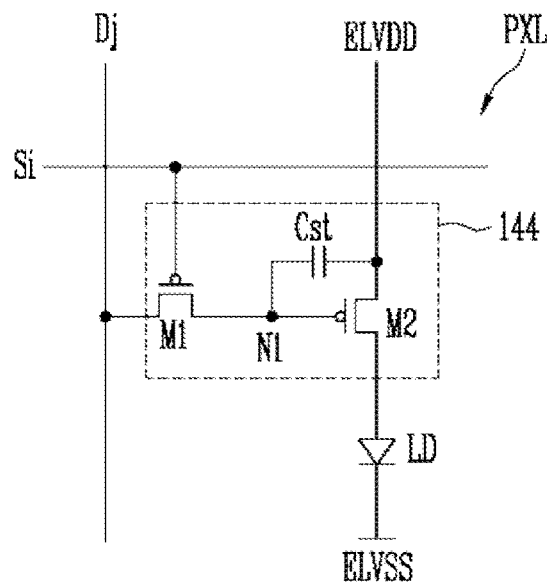
FIGS. 4A to 4C are circuit diagrams illustrating unit emission areas of the light emitting device according to some example embodiments of the present invention, and particularly, are circuit diagrams illustrating examples of pixels forming an active light emitting display panel.
Figure 4B:
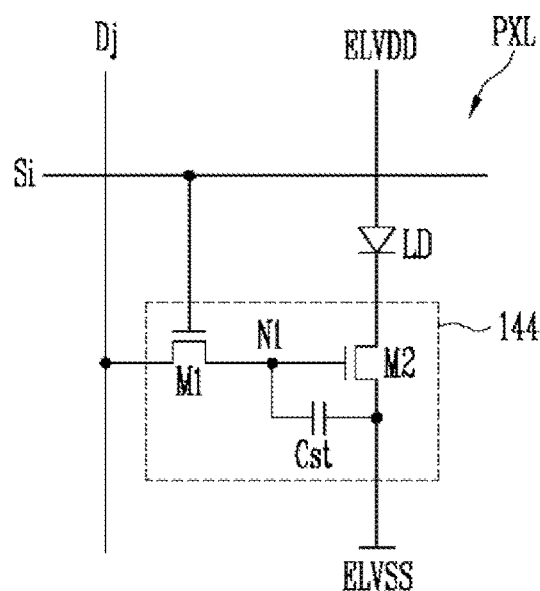
Figure 4C:
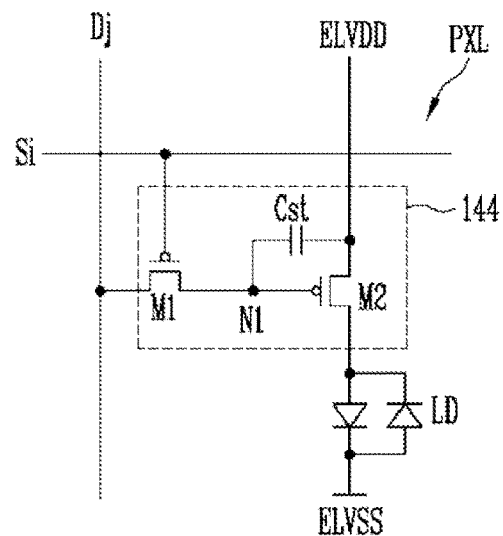

FIGS. 4A to 4C are circuit diagrams illustrating unit emission areas of the light emitting device according to some example embodiments of the present invention, and particularly, are circuit diagrams illustrating examples of pixels forming an active light emitting display panel. In FIGS. 4A to 4C, the same reference numeral is assigned to the constituent element which is the same as or similar to the constituent element of FIGS. 3A to 3E, and a detailed description thereof will be omitted. In some example embodiments of the present invention, a unit emission area may include one pixel PXL.

Referring to FIG. 4A, the pixel PXL includes one or more rod-shaped LEDs LDs, and a pixel circuit 144 connected to the one or more rod-shaped LEDs LDs.

A first electrode (for example, an anode electrode) of the rod-shaped LED LD is connected to a first pixel power source ELVDD via the pixel circuit 144, and a second electrode (for example, a cathode electrode) of the rod-shaped LED LD is connected to a second pixel power source ELVSS. The first pixel power source ELVDD and the second pixel power source ELVSS may have different potentials. For example, the second pixel power source ELVSS may have a potential lower than the potential of the first pixel power source ELVDD by a threshold voltage of the rod-shaped LED LD or more. Each of the rod-shaped LEDs LDs emits light with luminance corresponding to a driving current controlled by the pixel circuit 144.

Additionally, FIG. 4A illustrates an example embodiment in which the pixel includes only one rod-shaped LED LD, but embodiments of the present invention are not limited thereto. For example, the pixel PXL may include a plurality of rod-shaped LEDs LDs connected in parallel.

According to some example embodiments of the present invention, the pixel circuit 144 includes first and second transistors M1 and M2, and a storage capacitor Cst. However, the structure of the pixel circuit 144 is not limited to the example embodiment illustrated in FIG. 4A.

A first electrode of the first transistor (switching transistor) M1 is connected to a data line Dj, and a second electrode thereof is connected to a first node N1. Herein, the first electrode and the second electrode of the first transistor M1 are different electrodes, and for example, when the first electrode is a source electrode, the second electrode may be a drain electrode. Further, a gate electrode of the first transistor M1 is connected to a scan line Si. The first transistor M1 is turned on when a scan signal having a voltage (for example, a low voltage), by which the first transistor M1 may be turned on, is supplied from the scan line Si, to electrically connect the data line Dj and the first node N1. In this case, a data signal of a corresponding frame is supplied to the data line Dj, and thus the data signal is transmitted to the first node N1. The data signal transmitted to the first node N1 is charged in the storage capacitor Cst.

A first electrode of the second transistor (driving transistor) M2 is connected to the first pixel power source ELVDD, and a second electrode thereof is connected to the first electrode of the rod-shaped LED LD. Further, a gate electrode of the second transistor M2 is connected to the first node N1. The second transistor M2 controls the quantity of driving current supplied to the rod-shaped LED LD in response to the voltage of the first node N1.

One electrode of the storage capacitor Cst is connected to the first pixel power source ELVDD, and another electrode thereof is connected to the first node N1. The storage capacitor Cst charges a voltage corresponding to the data signal supplied to the first node N1, and maintains the charged voltage until a data signal of a next frame is supplied.

For convenience of the description, FIG. 4A illustrates the pixel circuit 144 having a comparatively simple structure including the first transistor M1 or transmitting the data signal to an internal side of the pixel PXL, the storage capacitor Cst for storing the data signal, and the second transistor M2 for supplying the driving current corresponding to the data signal to the rod-shaped LED LD. However, the present disclosure is not limited thereto, and the structure of the pixel circuit 144 may be variously modified and implemented. For example, the pixel circuit 144 may further include one or more transistor elements, such as a transistor element for compensating for a threshold voltage of the second transistor M2, a transistor element for initializing the first node N1, and/or a transistor element for controlling an emission time of the rod-shaped LED LD, or other circuit elements, such as a boosting capacitor or boosting the voltage of the first node N1, as a matter of course.

Further, FIG. 4A illustrates all of the transistors, for example, the first and second transistors M1 and M2, included in the pixel circuit 144 are illustrated in a p-type, but the present disclosure is not limited thereto. That is, at least one of the first and second transistors M1 and M2 included in the pixel circuit 144 may also be changed to an n-type transistor.

Referring to FIG. 4B, according to some example embodiments of the present invention, first and second transistors M1 and M2 may be implemented with N-type transistors. A configuration or an operation of a pixel circuit 144 illustrated in FIG. 4B is similar to the configuration or the operation of the pixel circuit 144 illustrated in FIG. 4A, except for a change in a connection position of some elements by the change in the type of the transistor. Accordingly, some description of the similar configuration or operation will be omitted for brevity.

Referring to FIG. 4C, according to some example embodiments of the present invention, a pixel PXL may include a plurality of rod-shaped LEDs LDs connected in different directions. In this case, the pixel PXL may be direct-current driven or alternating-current driven. This has been described above with reference to FIG. 3E, so that a detailed description thereof will be omitted.

Figure 5:
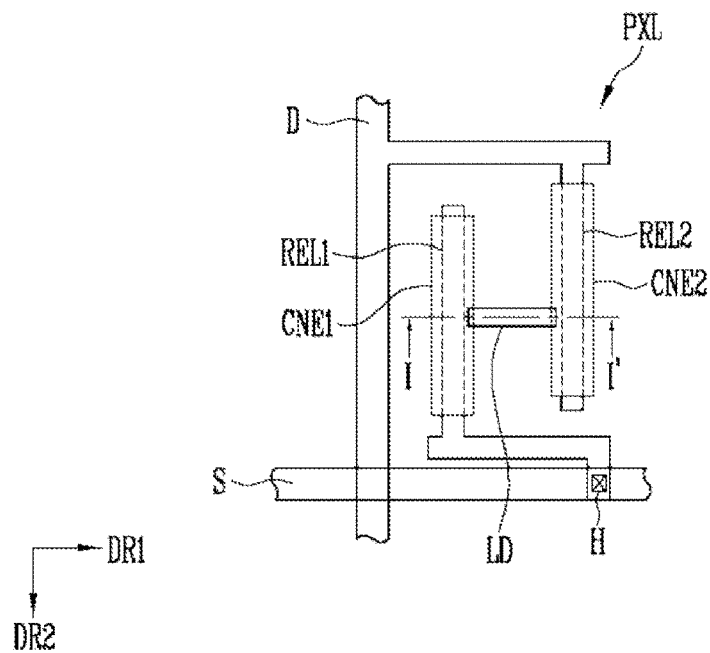
FIG. 5 is a top plan view illustrating a unit emission area of the light emitting device according to some example embodiments of the present invention.
Figure 6:
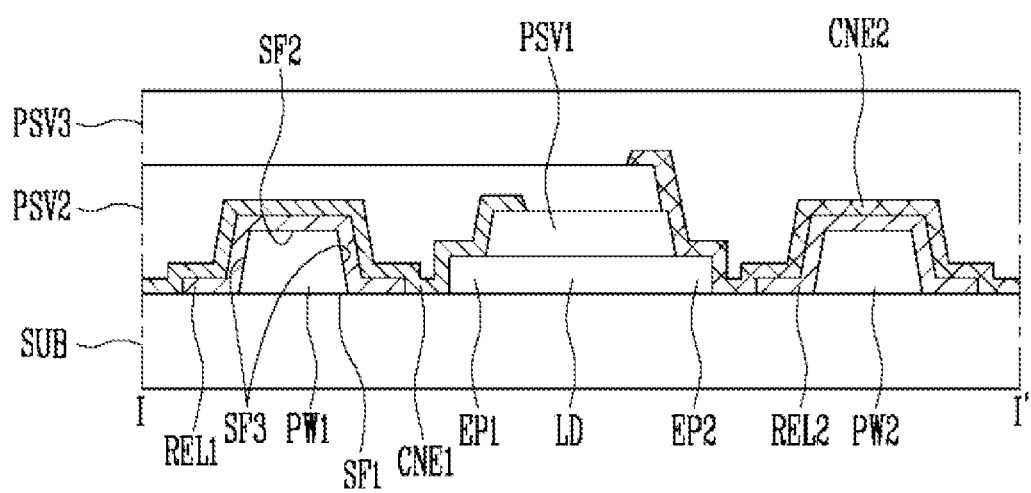
FIG. 6 is a cross-sectional view taken along line I-I' of FIG. 5.

FIG. 5 is a top plan view illustrating a unit emission area of a light emitting device according to some example embodiments of the present invention, and FIG. 6 is a cross-sectional view taken along line I-I' of FIG. 5. FIGS. 5 and 6 illustrate a pixel which is applicable to a light emitting display panel that is a sort of light emitting device, but the present disclosure is not limited thereto. Further, FIG. 5 illustrates an example embodiment, in which one rod-shaped LED is included in a unit emission area, but the present disclosure is not limited thereto. For example, a plurality of rod-shaped LEDs may be provided in the unit emission area.

Further, FIG. 5 illustrates the case where the rod-shaped LED is aligned in a horizontal direction for convenience of the illustration, but the arrangement of the rod-shaped LED is not limited thereto. For example, the rod-shaped LED may also be aligned in a diagonal direction between first and second reflection electrodes.

Further, in FIG. 5, the unit emission area may be a pixel area including one pixel PXL.

Referring to FIGS. 5 and 6, the light emitting device according to some example embodiments of the present invention may include one or more pixels PXLs. Each pixel PXL may include a substrate SUB, first and second partition walls PW1 and PW2, a rod-shaped LED LD, first and second reflection electrodes REL1 and REL2, and first and second contact electrodes CNE1 and CNE2.

The substrate SUB may be provided in various plate shapes. The substrate SUB may have an approximate quadrangular shape, particularly, a rectangular shape. However, the shape of the substrate SUB is not limited thereto, and the substrate SUB may have various shapes. For example, the substrate SUB may be provided in various shapes, such as a polygon having a closed shape including a straight side, a circle and an ellipse including a curved side, and a semicircle and a half ellipse including a side formed of a straight line and a curved line. In some example embodiments of the present invention, when the substrate SUB has a straight side, at least a part of the corners of each shape may have a curved line. For example, when the substrate SUB has a rectangular shape, a portion, in which the adjacent straight sides meet, may be replaced with a curve line having a curvature (e.g., a predetermined curvature). That is, in a vertex portion of the rectangular shape, both adjacent ends may be connected to two adjacent straight sides and be formed of curve sides having a curvature (e.g., a predetermined curvature). The curvature may be differently set according to a position. For example, the curvature may be changed according to a start position of the curve line, a length of the curve line, and the like.

The substrate SUB may be formed of an insulating material, such as glass, organic polymer, and crystal. Further, the substrate SUB may be formed of a material having flexibility so as to be bendable or foldable, and may have a single-layer structure of a multi-layer structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may be variously changed.

The first and second partition walls PW1 and PW2 may be provided so as to be spaced apart from each other on the substrate SUB. In some example embodiments of the present invention, the first and second partition walls PW1 and PW2 may be disposed so as to be spaced apart from each other on the substrate SUB by a length of the rod-shaped LED LD or more.

Each of the first and second partition walls PW1 and PW2 may have a trapezoid shape having one surface SF1, which is in contact with the substrate SUB, an upper surface SF2, which faces the one surface SF1 and has a smaller width in a first direction DR1 than a width of the one surface SF1, and two lateral surfaces SF3, which connects the one surface SF1 and the upper surface SF2, as illustrated in FIG. 6. The two lateral surfaces SF3 of the first and second partition walls PW1 and PW2 may have an inclination having an angle (e.g., a predetermined angle).

In the first and second partition walls PW1 and PW2, gradients of the two lateral surfaces SF3 may be variously changed within the range, in which front efficiency of light emitted from both ends of the rod-shaped LED LD is improved.

The first and second partition walls PW1 and PW2 may be insulating materials including an inorganic material or an organic material, but is not limited thereto.

In some example embodiments of the present invention, the first partition wall PW1 and the second partition wall PW2 may be disposed on the same plane on the substrate SUB, and may have the same height.

The first reflection electrode REL1 may be disposed on the first partition wall PW1, and the second reflection electrode REL2 may be disposed on the second partition wall PW2. The first and second reflection electrodes REL1 and REL2 are thinner than the first and second partition walls PW1 and PW2, so that the first and second reflection electrodes REL1 and REL2 may be provided so as to correspond to the shapes of the first and second partition walls PW1 and PW2. Accordingly, each of the first and second reflection electrodes REL1 and REL2 may have a gradient corresponding to the gradient of the lateral surfaces SF3 of the first and second partition walls PW1 and PW2.

When viewed on a plane, the first and second reflection electrodes REL1 and REL2 may be provided so as to be spaced apart from each other on the substrate SUB. In some example embodiments of the present invention, the first and second reflection electrodes RL1 and REL2 may be disposed on the substrate SUB so as to be spaced apart from each other by a length of the rod-shaped LED LD or more, but are not limited thereto. For example, the first and second reflection electrodes REL1 and REL2 may be provided on the substrate SUB so as to be spaced apart from each other by a distance shorter than the length of the rod-shaped LED LD to overlap both ends of the rod-shaped LED LD, respectively. This will be described below with reference to FIG. 16.

In some example embodiments of the present invention, the first reflection electrode REL1 and the second reflection electrode REL2 may be disposed on the same plane on the substrate SUB, and may have the same height. When the first and second reflection electrodes REL1 and REL2 have the same height, the rod-shaped LED LD may be more stably positioned on the first and second reflection electrodes REL1 and REL2.

In some example embodiments of the present invention, for convenience of the description, it is illustrated that the first and second reflection electrodes REL1 and REL2 are provided on the substrate SUB, on which the first and second partition walls PW1 and PW2 are provided, but the present disclosure is not limited thereto. For example, elements for driving the light emitting device with a passive matrix or an active matrix may be further provided between the first and second reflection electrodes REL1 and REL2 and the substrate SUB. For example, when the light emitting device is driven with the active matrix, signal lines, an insulating layer, and/or a thin film transistor may be provided between the first and second reflection electrodes REL1 and REL2 and the substrate SUB. The signal lines may include a scan line and a data line, and the thin film transistor may be connected to the signal lines, and may include a gate electrode, a semiconductor pattern, a source electrode, and a drain electrode. Any one of the source and the drain electrodes may be connected to any one reflection electrode between the first and second reflection electrodes REL1 and REL2, and a data signal of the data line may be applied to the one reflection electrode through the thin film transistor. Here, the signal lines, the insulating layer, and/or the thin film transistor may be provided with various numbers and in various shapes as a matter of course. This will be described below with reference to FIGS. 17 and 18.

The first and second reflection electrodes REL1 and REL2 may be formed of a conductive material. The conductive material may include a metal, such as Ag, Mg, Al, Pt, Pd, Au, Ni, Nd, Ir, and Cr, and an alloy thereof, a conductive oxide, such as an indium tin oxide (ITO), an indium zinc oxide (IZO), a zinc oxide (ZnO), an indium tin zinc oxide (ITZO), and a conductive polymer, such as PEDOT, and the like. Further, the first and second reflection electrodes REL1 and REL2 may be formed of a single layer, but are not limited thereto, and may be formed of multiple layers, in which two or more materials among metals, alloys, conductive oxides, and conductive polymers are laminated.

Here, the materials of the first and second reflection electrodes REL1 and REL2 are not limited to the aforementioned materials. For example, the first and second reflection electrodes REL1 and REL2 may be formed of a conductive materials having uniform reflectance so that light emitted from both ends of the rod-shaped LED LD moves in a direction (for example, a front direction), in which the image is displayed. Further, the first and second reflection electrodes REL1 and REL2 may be formed of a different material from those of the first and second partition walls PW1 and PW2.

The first reflection electrode REL1 may be connected to a first electrode line S through a contact hole H, and may receive a voltage applied to the first electrode line S. The second reflection electrode REL2 may be extended from a second electrode line D and connected to the second electrode line D, and may receive a voltage applied to the second electrode line D. Accordingly, an electric field may be formed between the first reflection electrode REL1 and the second reflection electrode REL2.

The rod-shaped LED LD may be provided between the first and second reflection electrodes REL1 and REL2 on the substrate SUB. Self-aligning of the rod-shaped LED LD may be induced by the electric field formed between the first and second reflection electrodes REL1 and REL2. Here, the rod-shaped LED LD may be provided in a rod shape extended in the first direction DR1.

The rod-shaped LED LD may include first and second conductive semiconductor layers 11 and 13 (see FIG. 1), and an active layer 12 (see FIG. 1) interposed between the first and second conductive semiconductor layers 11 and 13.

The rod-shaped LED LD may have a first end portion EP1 and a second end portion EP2 along the first direction DR1. One of the first and second conductive semiconductor layers 11 and 13 may be disposed at the first end portion EP1, and the other of the first and second conductive semiconductor layers 11 and 13 may be disposed at the second end portion EP2.

The first contact electrode CNE1 for electrically and/or physically stably connecting the first reflection electrode REL1 and the first end portion EP1 of the rod-shaped LED LD may be disposed on the first reflection electrode REL1.

The first contact electrode CNE1 may be in ohmic-contact with an upper portion of the first reflection electrode REL1. The first contact electrode CNE1 may be formed of a transparent conductive materials, such as an ITO, an IZO, and an ITZO, so as to allow the light emitted from the rod-shaped LED LD to pass through, but is not limited thereto. For example, the first contact electrode CNE1 may be formed of a conductive material including Al, Ti, Cr, and the like, of which a work function is smaller than about 4.1 eV.

When viewed on a plane, the first contact electrode CNE1 may cover the first reflection electrode REL1 and overlap the first reflection electrode REL1. Further, the first contact electrode CNE1 may partially overlap the first end portion EP1 of the rod-shaped LED LD.

The second contact electrode CNE2 for electrically and/or physically stably connecting the second reflection electrode REL2 and the second end portion EP2 of the rod-shaped LED LD may be disposed on the second reflection electrode REL2.

The second contact electrode CNE2 may be in ohmic-contact with an upper portion of the second reflection electrode REL2. The second contact electrode CNE2 may be formed of the same material as that of the first contact electrode CNE1, but is not limited thereto. For example, the second contact electrode CNE2 may be formed of a conductive material including Ni, an ITO, and the like, of which a work function is larger than about 7.5 eV.

When viewed on a plane, the second contact electrode CNE2 may cover the second reflection electrode REL2 and overlap the second reflection electrode REL2. Further, the second contact electrode CNE2 may partially overlap the second end portion EP2 of the rod-shaped LED LD.

Hereinafter, a structure of the light emitting device according to some example embodiments of the present invention will be described according to a lamination sequence with reference to FIGS. 5 and 6.

The first and second partition walls PW1 and PW2 may be provided on the substrate SUB. The first and second partition walls PW1 and PW2 may be disposed so as to be spaced apart from each other on the substrate SUB. The first and second partition walls PW1 and PW2 may be formed of an insulating material.

The first reflection electrode REL1 may be disposed on the first partition wall PW1, and the second reflection electrode REL2 may be disposed on the second partition wall PW2. The first and second reflection electrodes REL1 and REL2 may be disposed on the same plane on the corresponding partition walls PW1 and PW2, and may have the same height as those of the partition walls PW1 and PW2. Further, the first and second reflection electrodes REL1 and REL2 may be formed of the same material. The first and second reflection electrodes REL1 and REL2 may be disposed so as to be spaced apart from each other on the substrate SUB.

The rod-shaped LED LD may be aligned between the first and second reflection electrodes REL1 and REL2. Self-aligning of the rod-shaped LED LD may be induced by the electric field formed between the first and second reflection electrodes REL1 and REL2. The rod-shaped LED LD may be provided on the substrate SUB so that both end portions, that is, the first and second end portions EP1 and EP2, of the rod-shaped LED LD, do not overlap the first and second reflection electrodes REL1 and REL2.

A first passivation layer PSV1 covering a part of an upper surface of the rod-shaped LED LD may be provided on the rod-shaped LED LD. Accordingly, the first and second end portions EP1 and EP2 of the rod-shaped LED LD may be exposed to the outside. Here, the first passivation layer PSV1 may include any one insulating material between an inorganic insulating material and an organic insulating material.

The first contact electrode CNE1 may be disposed on the substrate SUB, on which the first passivation layer PSV1 is provided. The first contact electrode CNE1 may cover the first reflection electrode REL1 and may be connected to the first reflection electrode REL1. Further, the first contact electrode CNE1 may overlap the first end portion EP1 of the rod-shaped LED LD and may be connected to the first end portion EP1 of the rod-shaped LED LD when viewed on a plane. Accordingly, the first end portion EP1 of the rod-shaped LED LD and the first reflection electrode REL1 may be electrically and/or physical connected through the first contact electrode CNE1.

A second passivation layer PSV2 may be provided on the substrate SUB, on which the first contact electrode CNE1 is provided. The second passivation layer PSV2 may be provided on the substrate SUB so as to cover the first contact electrode CNE1 and the first passivation layer PSV1. Further, the second passivation layer PSV2 may include an opening for exposing the second end portion EP2 of the rod-shaped LED LD and the second reflection electrode REL2 to the outside. Here, the second passivation layer PSV2 may be formed of the same material as that of the first passivation layer PSV1, but is not limited thereto.

The second contact electrode CNE2 may be disposed on the substrate SUB, on which the second passivation layer PSV2 is provided. The second contact electrode CNE2 may cover the second reflection electrode REL2 and may be connected to the second reflection electrode REL2. Further, the second contact electrode CNE2 may overlap the second end portion EP2 of the rod-shaped LED LD and may be connected to the second end portion EP2 of the rod-shaped LED LD when viewed on a plane. Accordingly, the second end portion EP2 of the rod-shaped LED LD and the second reflection electrode REL2 may be electrically and/or physical connected through the second contact electrode CNE2.

As described above, the second contact electrode CNE2 is disposed on the first contact electrode CNE1, so that the first and second contact electrodes CNE1 and CNE2 may be disposed on different layers. In this case, each of the first and second electrodes CNE1 and CNE2 may be formed to include different materials. For example, the first contact electrode CNE1 may be formed of a conductive material including Al, Ti, Cr, and the like, of which a work function is smaller than about 4.1 eV for an ohmic contact between any one of the first and second conductive semiconductor layers 11 and 13 of the rod-shaped LED LD and the first reflection electrode REL1. The second contact electrode CNE2 may be formed of a conductive material including Ni, an ITO, and the like, of which a work function is larger than about 7.5 eV for an ohmic contact between the other one of the first and second conductive semiconductor layers 11 and 13 of the rod-shaped LED LD and the second reflection electrode REL2.

A third passivation layer PSV3 may be provided on the substrate SUB, on which the second contact electrode CNE2 is provided. The third passivation layer PSV3 may prevent oxygen and moisture from permeating into the rod-shaped LED LD. The third passivation layer PSV3 may include an inorganic layer. The inorganic layer may include at least one of a silicon oxide, a silicon nitride, a silicon oxynitride, an aluminum oxide, a titanium oxide, a zirconium oxide, and a tin oxide.

As described above, in the light emitting device according to some example embodiments of the present invention, the first and second partition walls PW1 and PW2 may be formed of an insulating material, which enables thicknesses and gradients of the first and second partition walls PW1 and PW2 to be relatively easily adjusted, compared to a conductive material. In this case, heights and gradients of the first and second reflection electrodes REL1 and REL2 provided on the upper surfaces SF2 and the lateral surfaces SF3 of the first and second partition walls PW1 and PW2 may be easily changed by adjusting the heights and the gradients of the first and second partition walls PW1 and PW2. Accordingly, it is possible to easily adjust the heights and the gradients of the first and second partition walls PW1 and PW2 so as to improve front light emission efficiency of the rod-shaped LED LD. For example, in the case where front light emission efficiency of the rod-shaped LED LD is optimal when the gradients of the first and second reflection electrodes REL1 and REL2 are about 45° to 50°, the heights and the gradients of the first and second reflection electrodes REL1 and REL2 may be easily adjusted by adjusting the heights and the gradients of the first and second reflection electrodes REL1 and REL2.

In the existing light emitting device, the light emitted from both end portions of the rod-shaped LED LD moves in a front direction through the first and second reflection electrodes REL1 and REL2, which have the heights and the gradients of a level (e.g., a predetermined level) or more, and are formed of a single metal material. Because the first and second reflection electrodes REL1 and REL2 have the heights and the gradients of the level (e.g., the predetermined level) or more and are formed of the single metal material, it may not easy to change the heights and the gradients of the first and second reflection electrodes REL1 and REL2 for improving front light emission efficiency of the rod-shaped LED LD.

In this respect, in some example embodiments of the present invention, the first and second partition walls PW1 and PW2 may be disposed under the first and second reflection electrodes REL1 and REL2 so as to correspond to the first and second reflection electrodes REL1 and REL2, respectively, and the heights and the gradients of the first and second reflection electrodes REL1 and REL2 may be easily adjusted by adjusting the heights and the gradients of the first and second partition walls PW1 and PW2. Accordingly, front light emission efficiency of the rod-shaped LED LD may be improved.

Further, in the light emitting device according to some example embodiments of the present invention, the rod-shaped LED LD may be aligned in a desired direction by easily adjusting the heights and the gradients of the first and second reflection electrodes REL1 and REL2. Accordingly, an aligning defect of the rod-shaped LED LD may be minimized.

Further, in the light emitting device according to some example embodiments of the present invention, the first and second contact electrodes CNE1 and CNE2 may be disposed on different layers and may be formed so as to include different materials. In this case, a process margin for a fine pattern process may be secured, compared to a general light emitting device, in which the first and second contact electrodes CNE1 and CNE2 are disposed on the same layer and are formed to include the same material. Here, the fine pattern process may mean a process of performing patterning so that the first and second contact electrodes CNE1 and CNE2 provided on the substrate SUB are spaced apart from each other by an interval (e.g., a predetermined interval).

Further, in the light emitting device according to some example embodiments of the present invention, the first and second contact electrodes CNE1 and CNE2 are formed to include different materials to rapidly electrically and/or physically connect the first and second reflection electrodes REL1 and REL2 and the rod-shaped LED LD, thereby further improving light emission efficiency of the rod-shaped LED LD.

FIGS. 7 to 14 are cross-sectional views sequentially illustrating a method of manufacturing the light emitting device illustrated in FIG. 6.

Figure 7:
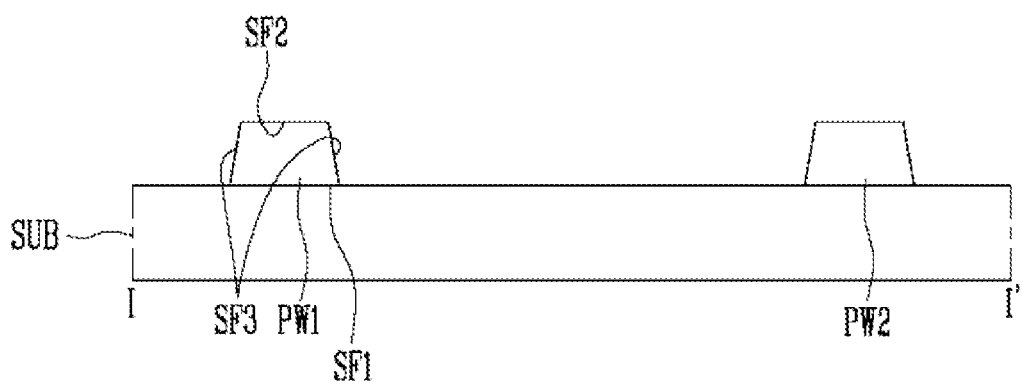
FIGS. 7 to 14 are cross-sectional views sequentially illustrating a method of manufacturing the light emitting device illustrated in FIG. 6.

Referring to FIGS. 6 and 7, first and second partition walls PW1 and PW2 may be formed on a substrate SUB. The first and second partition walls PW1 and PW2 may be spaced apart from each other on the substrate SUB.

Each of the first and second partition walls PW1 and PW2 may have a trapezoid shape including one surface SF1, which is in contact with the substrate SUB, an upper surface SF2 facing the one surface SF1, and two lateral surfaces SF3 connecting the one surface SF1 and the upper surface SF2. Here, a width of the upper surface SF2 in a first direction DR1 (see FIG. 5) of the substrate SUB may be smaller than a width of the one surface SF1. Further, the two lateral surfaces SF3 may have a gradient with an angle (e.g., a predetermined angle). The first and second partition walls PW1 and PW2 may be disposed on the same plane and may have the same height.

Figure 8:
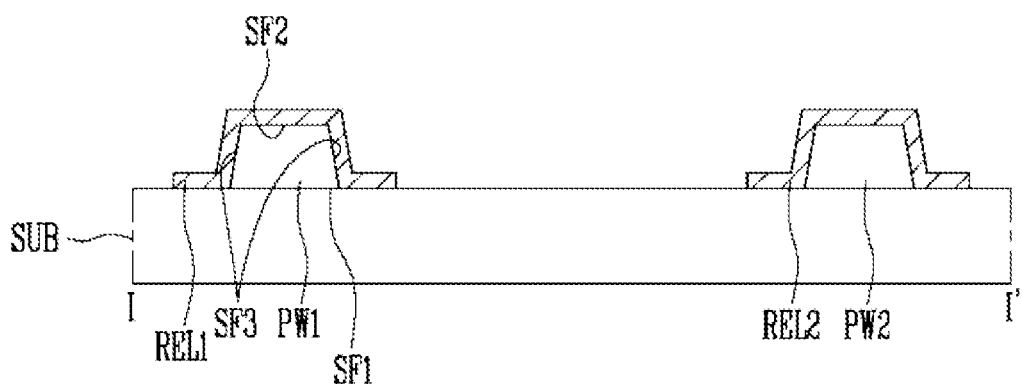

Referring to FIGS. 6 and 8, first and second reflection electrodes REL1 and REL2 may be formed on the first and second partition walls PW1 and PW2. The first reflection electrode REL1 may be formed on the first partition wall PW1, and the second reflection electrode REL2 may be formed on the second partition wall PW2. The first and second reflection electrodes REL1 and REL2 may be spaced apart from each other by an interval (e.g., a predetermined interval). The first reflection electrode REL1 may correspond to a shape of the first partition wall PW1, and the second reflection electrode REL2 may correspond to a shape of the second partition wall PW2. Accordingly, the first reflection electrode REL1 may have a gradient corresponding to the gradient of the first partition wall PW1, and the second reflection electrode REL2 may have a gradient corresponding to the gradient of the second partition wall PW2.

Figure 9:
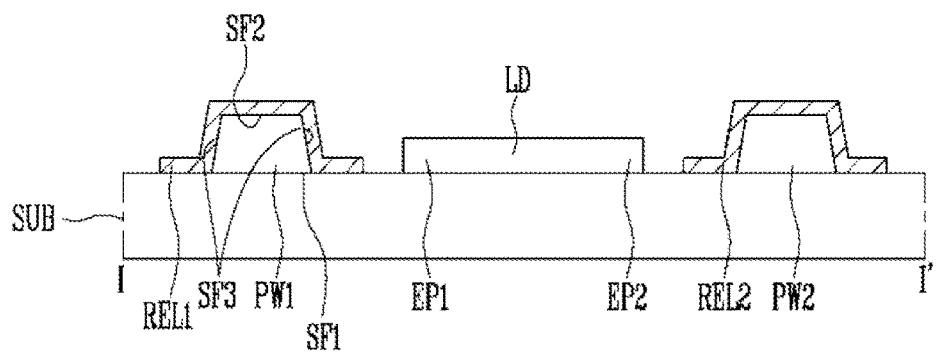

Referring to FIGS. 6 and 9, a rod-shaped LED LD is injected and aligned on the substrate SUB, on which the first and second reflection electrodes REL1 and REL2 are provided. The rod-shaped LED LD may be injected by using an inkjet printing method and the like, but embodiments of the present invention are not limited thereto. After the rod-shaped LED LD is injected (or at the same time as the injection of the rod-shaped LED LD) by using the inkjet printing method and the like, self-aligning of the rod-shaped LED LD may be induced by an electric field formed between the first and second reflection electrodes REL1 and REL2. Accordingly, the rod-shaped LED LD may be disposed between the first and second reflection electrodes REL1 and REL2. Here, both ends, that is, first and second end portions EP1 and EP2, of the rod-shaped LED LD may not overlap the first and second reflection electrodes REL1 and REL2.

Figure 10:
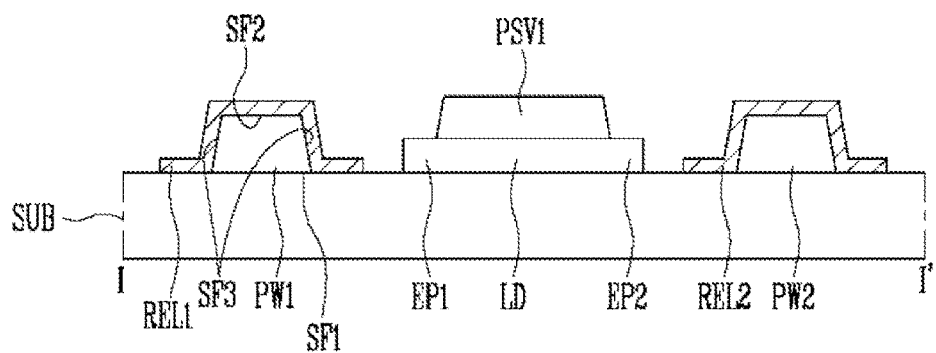

Referring to FIGS. 6 and 10, an insulating material layer is applied onto a front surface of the substrate SUB, on which the rod-shaped LED LD is provided, a first passivation layer PSV1 covering an upper surface of the rod-shaped LED LD may be formed by using a mask process and the like. Here, the first passivation layer PSV1 may be patterned so as to expose the first and second end portions EP1 and EP2 of the rod-shaped LED LD, but is not limited thereto. For example, the first passivation layer PSV1 may be patterned by the mask process to expose the first end portion EP1 of the rod-shaped LED LD, and then may be patterned together with a second passivation layer PSV2 formed by a subsequent process to expose the second end portion EP2 of the rod-shaped LED LD.

Figure 11:
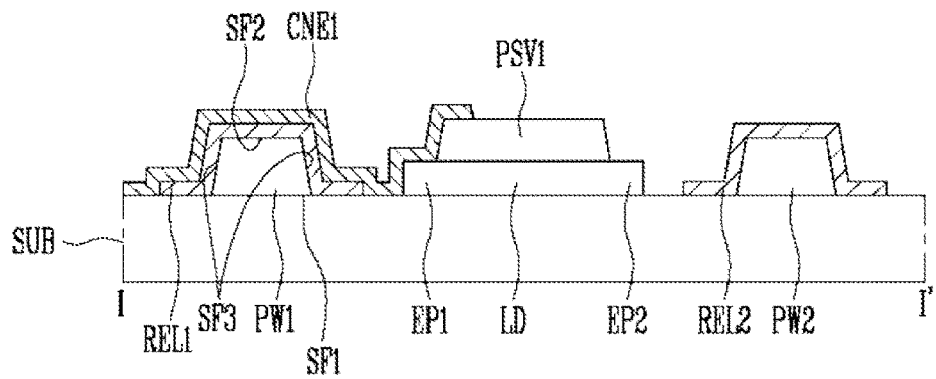

Referring to FIGS. 6 and 11, a first contact electrode CNE1 may be formed on the substrate SUB, on which the first passivation layer PSV1 is provided. The first contact electrode CNE1 may cover the first reflection electrode REL1 and may be connected to the first reflection electrode REL1. Further, the first contact electrode CNE1 may cover the first end portion EP1 of the rod-shaped LED LD. The first contact electrode CNE1 may electrically and/or physically connect the first reflection electrode REL1 and the first end portion EP1 of the rod-shaped LED LD.

Figure 12:
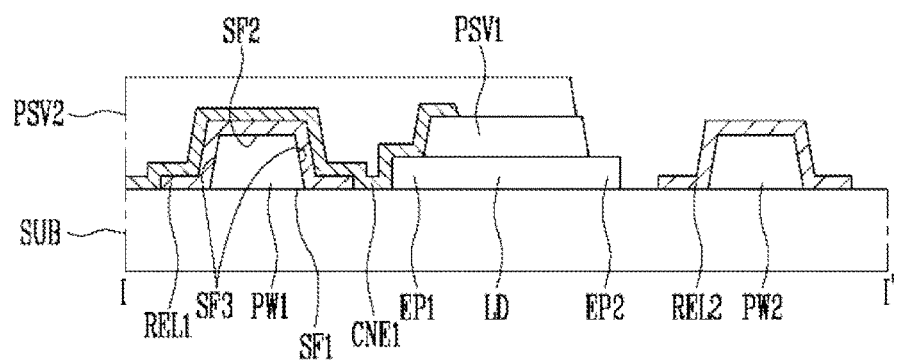

Referring to FIGS. 6 and 12, an insulating material layer is applied on to the front surface of the substrate SUB, on which the first contact electrode CNE1 is provided, and then the second passivation layer PSV2 covering the first contact electrode CNE1 and the first passivation layer PSV1 may be formed by using a mask process and the like. The first and second passivation layers PSV1 and PSV2 may be formed to include the same insulating material, but are not limited thereto. Here, the second passivation layer PSV2 may include an opening for exposing the second end portion EP2 of the rod-shaped LED LD and the second reflection electrode REL2 to the outside.

Figure 13:
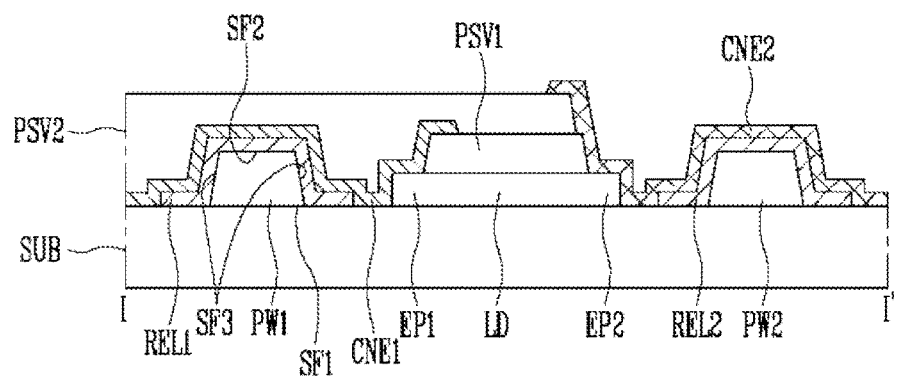

Referring to FIGS. 6 and 13, a second contact electrode CNE2 may be formed on the substrate SUB, on which the second passivation layer PSV2 is provided. The second contact electrode CNE2 may cover the second reflection electrode REL2 and may be connected to the second reflection electrode REL2. Further, the second contact electrode CNE2 may cover the second end portion EP2 of the rod-shaped LED LD. The second contact electrode CNE2 may electrically and/or physically connect the second reflection electrode REL2 and the second end portion EP2 of the rod-shaped LED LD.

Figure 14:
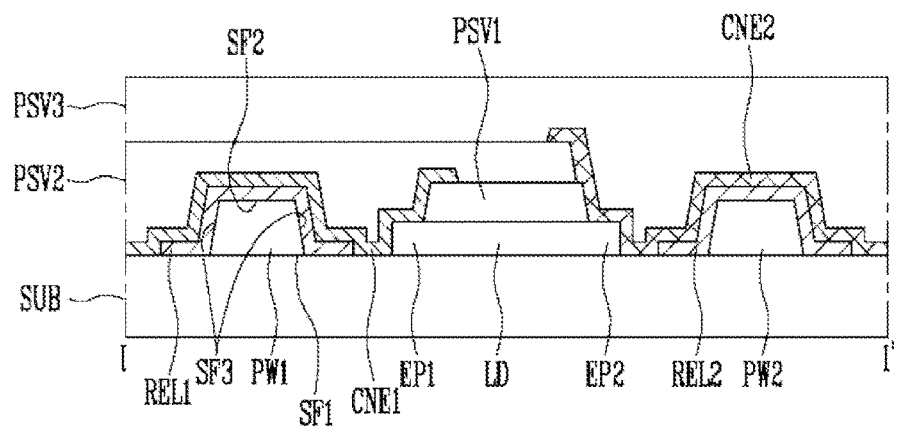

Referring to FIGS. 6 and 14, a third passivation layer PSV3 may be formed on the substrate SUB, on which the second contact electrode CNE2 is provided. The third passivation layer PSV3 may cover the second passivation layer PSV2 and the second contact electrode CNE2 for preventing oxygen and moisture from permeating into the rod-shaped LED LD.

Figure 15:
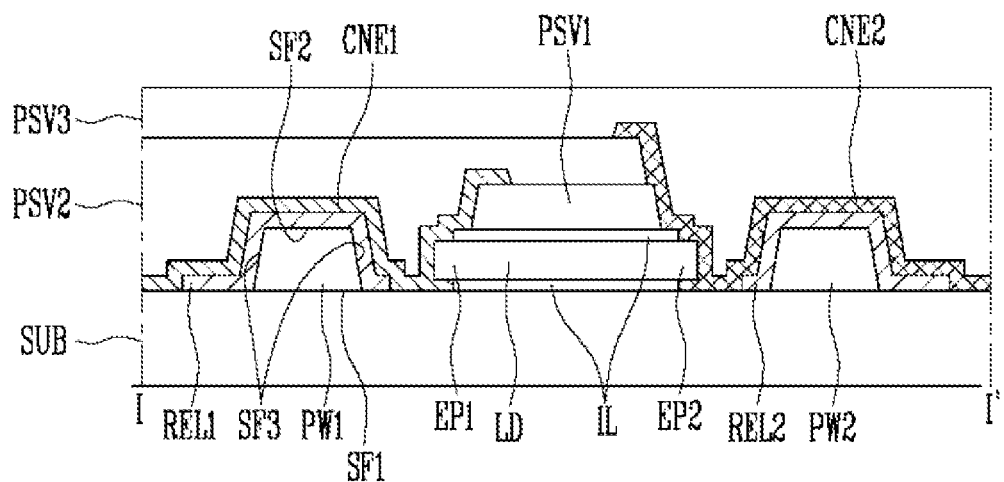
FIG. 15 is a diagram illustrating a unit emission area of a light emitting device according to some example embodiments of the present invention, and is a cross-sectional view taken along line I-I' of FIG. 5.

FIG. 15 is a diagram illustrating a unit emission area of a light emitting device according to some example embodiments of the present invention, and is a cross-sectional view taken along the line I-I' of FIG. 5. In some example embodiments of the present invention, in order to avoid an overlapping description, a different matter from that of the example embodiment will be mainly described. Parts, which are not particularly described in the present example embodiment, follow the parts of the aforementioned example embodiment, and the same reference numeral refers to the same element and the similar reference numeral refers to the similar element. In FIGS. 5 and 15, a unit emission area may be a pixel area including one pixel PXL.

Referring to FIGS. 5 and 15, the light emitting device according to some example embodiments of the present invention may include one or more pixels PXLs. Each pixel PXL may include a substrate SUB, first and second partition walls PW1 and PW2, a rod-shaped LED LD, first and second reflection electrodes REL1 and REL2, and first and second contact electrodes CNE1 and CNE2.

The first and second partition walls PW1 and PW2 may be disposed so as to be spaced apart from each other by an interval (e.g., a predetermined interval) on the substrate SUB, and may be formed to include an insulating material, which enables thicknesses and gradients of the first and second partition walls PW1 and PW2 to be relatively easily adjusted.

The first and second reflection electrodes REL1 and REL2 may be disposed on the corresponding partition walls PW1 and PW2, respectively. For example, the first reflection electrode REL1 may be disposed on the first partition wall PW1, and the second reflection electrode REL2 may be disposed on the second partition wall PW2.

The rod-shaped LED LD may be disposed between the first and second reflection electrodes REL1 and REL2 on the substrate SUB. The rod-shaped LED LD may include first and second conductive semiconductor layers 11 and 13 (see, e.g., FIG. 1), and an active layer 12 (see, e.g., FIG. 1) interposed between the first and second conductive semiconductor layers 11 and 13.

Here, an outer circumferential surface of the rod-shaped LED LD may be covered by an insulating film IL. The insulating film IL may be an element for preventing an electric short generable when the active layer 12 of the rod-shaped LED LD is in contact with the first and second contact electrodes CNE1 and CNE2. In some example embodiments of the present invention, it is illustrated that the insulating film IL surrounds the remaining portion, except for first and second end portions EP1 and EP2, in the outer circumferential surface of the rod-shaped LED LD, but the present disclosure is not limited thereto. For example, the insulating film IL may cover the entire outer circumferential surface of the rod-shaped LED LD including first and second end portions EP1 and EP2 for preventing durability of the rod-shaped LED LD from being degraded. The insulating film IL may include one or more insulating materials selected from the group consisting of $SiO_2$, $Si_3N_4$, $Al_2O_3$, and $TiO_2$, but is not limited thereto, and various materials having an insulating property may be used.

A first passivation layer PSV1 may be provided on the rod-shaped LED LD, of which the outer circumferential surface is covered by the insulating film IL. The first passivation layer PSV1 may cover the insulating film IL and the rod-shaped LED LD.

The first contact electrode CNE1 may be disposed on the substrate SUB, on which the first passivation layer PSV1 is provided. The first contact electrode CNE1 may cover the first reflection electrode REL1 and may be connected to the first reflection electrode REL1. Further, the first contact electrode CNE1 may overlap the first end portion EP1 of the rod-shaped LED LD and may be connected to the first end portion EP1 of the rod-shaped LED LD.

A second passivation layer PSV2 may be provided on the substrate SUB, on which the first contact electrode CNE1 is provided.

The second contact electrode CNE2 may be disposed on the substrate SUB, on which the second passivation layer PSV2 is provided. The second contact electrode CNE2 may cover the second reflection electrode REL2 and may be connected to the second reflection electrode REL2. Further, the second contact electrode CNE2 may overlap the second end portion EP2 of the rod-shaped LED LD and may be connected to the second end portion EP2 of the rod-shaped LED LD.

A third passivation layer PSV3 may be provided on the substrate SUB, on which the second contact electrode CNE2 is provided.

Figure 16:
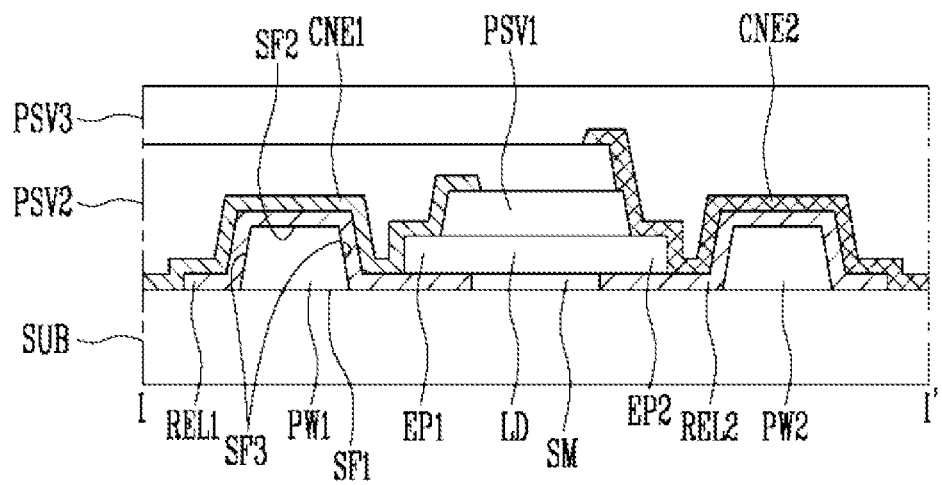
FIG. 16 is a diagram illustrating a unit emission area of a light emitting device according to some example embodiments of the present invention, and is a cross-sectional view taken along line I-I' of FIG. 5.

FIG. 16 is a diagram illustrating a unit emission area of a light emitting device according to some example embodiments of the present invention, and is a cross-sectional view taken along the line I-I' of FIG. 5. In some example embodiments of the present invention, in order to avoid an overlapping description, a different matter from that of the example embodiment will be mainly described. Parts, which are not particularly described in the present example embodiment, follow the parts of the aforementioned example embodiment, and the same reference numeral refers to the same element and the similar reference numeral refers to the similar element. In FIGS. 5 and 16, a unit emission area may be a pixel area including one pixel PXL.

Referring to FIGS. 5 and 16, the light emitting device according to some example embodiments of the present invention may include one or more pixels PXLs. Each pixel PXL may include a substrate SUB, first and second partition walls PW1 and PW2, a rod-shaped LED LD, first and second reflection electrodes REL1 and REL2, and first and second contact electrodes CNE1 and CNE2. Further, the pixel PXL may further include a support member SM disposed between the substrate SUB and the rod-shaped LED LD.

The first and second partition walls PW1 and PW2 may be disposed so as to be spaced apart from each other by an interval (e.g., a predetermined interval) on the substrate SUB, and may be formed to include an insulating material, which enables thicknesses and gradients of the first and second partition walls PW1 and PW2 to be relatively easily adjusted.

The first and second reflection electrodes REL1 and REL2 may be provided on the corresponding partition walls PW1 and PW2, respectively. For example, the first reflection electrode REL1 may be disposed on the first partition wall PW1, and the second reflection electrode REL2 may be disposed on the second partition wall PW2.

The first and second reflection electrodes REL1 and REL2 may be provided while being spaced apart from each other by a distance shorter than a distance of the rod-shaped LED LD on the substrate so as to overlap both end portions of the rod-shaped LED LD, respectively, when viewed on a plane. That is, the first reflection electrode REL1 may be disposed on the first partition wall PW1 so as to overlap a first end portion EP1 between both end portions of the rod-shaped LED LD when viewed on a plane. Further, the second reflection electrode REL2 may be disposed on the second partition wall PW2 so as to overlap the second end portion EP2 facing the first end portion EP1 when viewed on a plane. Accordingly, the first end portion EP1 of the rod-shaped LED LD may be disposed on the first reflection electrode REL1, and the second end portion EP2 of the rod-shaped LED LD may be disposed on the second reflection electrode REL2.

The support member SM may be disposed between the rod-shaped LED LD and the substrate SUB. For example, the support member SM may be disposed on the substrate SUB so as to be filled in a vertical space between the substrate SUB and the rod-shaped LED LD. The support member SM stably supports the rod-shaped LED LD, thereby preventing the rod-shaped LED LD aligned between the first and second reflection electrodes REL1 and REL2 from deviating. The support member SM may include an insulating material. In some example embodiments of the present invention, the support member SM may have the same height as those of the first and second reflection electrodes REL1 and REL2, but is not limited thereto. For example, the support member may also have a different height from those of the first and second reflection electrodes REL1 and REL2.

The rod-shaped LED LD may be aligned on the support member SM. In this case, the first end portion EP1 of the rod-shaped LED LD may correspond to the first reflection electrode REL1, the second end portion EP2 of the rod-shaped LED LD may correspond to the second reflection electrode REL2, and the remaining portion, except for the first and second end portions EP1 and EP2, in the rod-shaped LED LD may correspond to the support member SM.

A first passivation layer PSV1 may be provided on the rod-shaped LED LD. The first passivation layer PSV1 may cover the rod-shaped LED LD.

The first contact electrode CNE1 may be disposed on the substrate SUB, on which the first passivation layer PSV1 is provided. The first contact electrode CNE1 may be disposed on the first reflection electrode REL1 and the first end portion EP1 of the rod-shaped LED LD and electrically and/or physically connect the first reflection electrode REL1 and the first end portion EP1 of the rod-shaped LED LD.

A second passivation layer PSV2 may be provided on the substrate SUB, on which the first contact electrode CNE1 is provided.

The second contact electrode CNE2 may be disposed on the substrate SUB, on which the second passivation layer PSV2 is provided. The second contact electrode CNE1 may be disposed on the second reflection electrode REL2 and the second end portion EP2 of the rod-shaped LED LD and electrically and/or physically connect the second reflection electrode REL2 and the second end portion EP2 of the rod-shaped LED LD.

A third passivation layer PSV3 may be provided on the substrate SUB, on which the second contact electrode CNE2 is provided.

Figure 17:
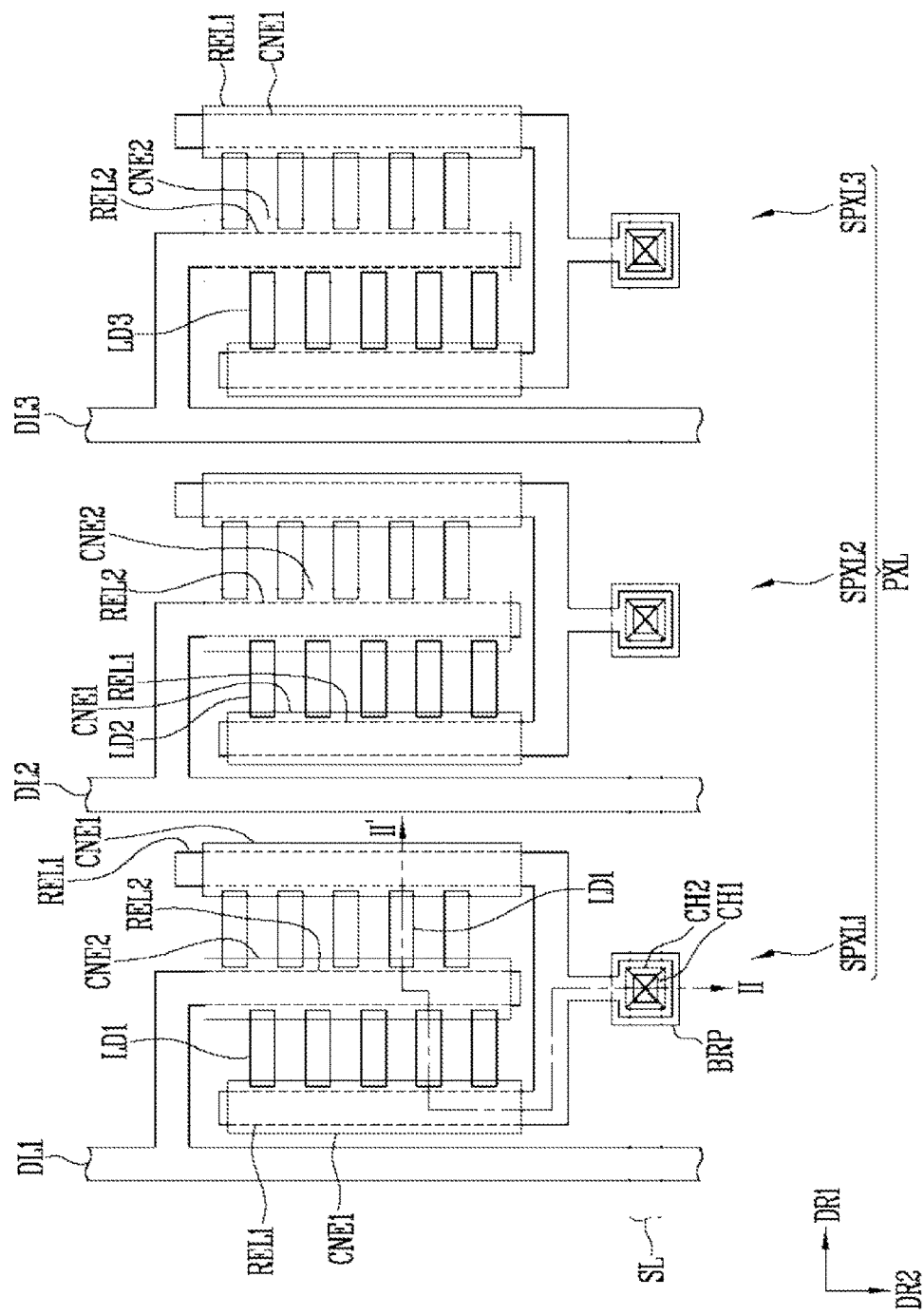
FIG. 17 is a top plan view illustrating a unit emission area of a light emitting device according to some example embodiments of the present invention.
Figure 18:
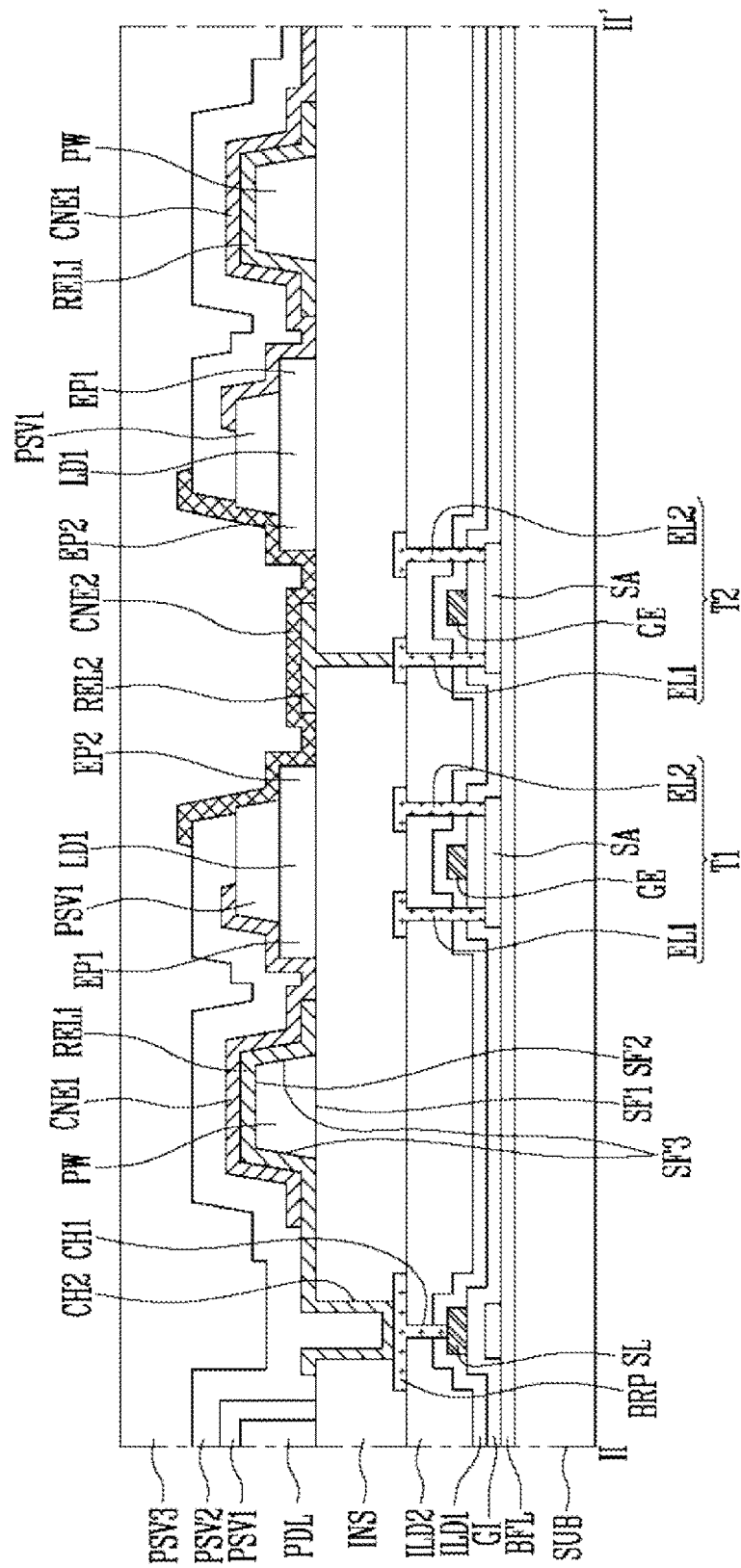
FIG. 18 is a cross-sectional view taken along the line II-II' of FIG. 17.

FIG. 17 is a top plan view illustrating a unit emission area of a light emitting device according to some example embodiments of the present invention, and FIG. 18 is a cross-sectional view taken along the line II-II' of FIG. 17.

FIGS. 17 and 18 illustrate a pixel which is applicable to a light emitting display panel that is a sort of light emitting device, but the present disclosure is not limited thereto. Further, FIG. 17 illustrates an example embodiment, in which a plurality of rod-shaped LEDs is included in a unit emission area, but the present disclosure is not limited thereto. For example, one rod-shaped LED may be provided in the unit emission area.

Further, FIG. 17 illustrates the case where the plurality of rod-shaped LEDs is aligned in a horizontal direction for convenience of the illustration, but the arrangement of the plurality of rod-shaped LEDs is not limited thereto. For example, the plurality of rod-shaped LEDs may also be aligned in a diagonal direction between first and second reflection electrodes.

Further, in FIG. 17, for convenience of the illustration, the illustration of a thin film transistor connected to the plurality of rod-shaped LEDs and signal lines connected to the thin film transistor is omitted.

In some example embodiments of the present invention, in order to avoid an overlapping description, a different matter from that of the example embodiment will be mainly described. Parts, which are not particularly described in the present example embodiment, follow the parts of the aforementioned example embodiment, and the same reference numeral refers to the same element and the similar reference numeral refers to the similar element. In FIG. 17, the unit emission area may be a pixel area including one pixel PXL including first to third sub pixels SPXL1, SPXL2, and SPXL3.

Referring to FIGS. 17 and 18, the light emitting device according to some example embodiments of the present invention may include one or more pixels PXLs. Each pixel PXL may include first to third sub pixels SPXL1, SPXL2, and SPXL3.

The first sub pixel SPXL1 may include a substrate SUB, a first rod-shaped LED LD1, a circuit element unit provided between the substrate SUB and the first rod-shaped LED LD1, and first and second reflection electrodes REL1 and REL2.

The second sub pixel SPXL2 may include the substrate SUB, a second rod-shaped LED LD2, a circuit element unit provided between the substrate SUB and the second rod-shaped LED LD2, and first and second reflection electrodes REL1 and REL2.

The third sub pixel SPXL3 may include the substrate SUB, a third rod-shaped LED LD3, a circuit element unit provided between the substrate SUB and the third rod-shaped LED LD3, and first and second reflection electrodes REL1 and REL2.

The circuit element unit provided in each of the first to third sub pixels SPXL1, SPXL2, and SPXL3 may include first and second transistors T1 and T2 and a storage capacitor provided on the substrate SUB.

The first transistor T1 may be a switching transistor for transferring a data signal into the corresponding sub pixels SPXL1, SPXL2, and SPXL3, and the second transistor T2 may be a driving transistor for supplying a driving current corresponding to the data signal to the corresponding rod-shaped LEDs LD1, LD2, and LD3. The storage capacitor Cst may charge a voltage corresponding to the data signal, and may maintain the charged voltage until a data signal of a next frame is supplied.

Each of the first to third rod-shaped LEDs LD1, LD2, and LD3 may be a light emitting diode emitting light of a different color. For example, the first rod-shaped LED LD1 may be a red light emitting diode emitting red light, the second rod-shaped LED LD2 may be a green light emitting diode emitting green light, and the third rod-shaped LED LD3 may be a blue light emitting diode emitting blue light.

A first end portion EP1 between both end portions of the first rod-shaped LED LD1 may be connected to the first reflection electrode REL1 connected to a first electrode line SL extended in a first direction DR1 of the substrate SUB. A second end portion EP2 between both end portions of the first rod-shaped LED LD1 may be connected to the second reflection electrode REL2 connected to a second-one electrode line DL1 extended in a second direction DR2 crossing the first direction DR1.

A first end portion EP1 between both end portions of the second rod-shaped LED LD2 may be connected to the first reflection electrode REL1 connected to the first electrode line SL. A second end portion EP2 between both end portions of the second rod-shaped LED LD2 may be connected to the second reflection electrode REL2 connected to a second-two electrode line DL2 extended in the second direction DR2.

A first end portion EP1 between both end portions of the third rod-shaped LED LD3 may be connected to the first reflection electrode REL1 connected to the first electrode line SL. A second end portion EP2 between both end portions of the third rod-shaped LED LD3 may be connected to the second reflection electrode REL2 connected to a second-three electrode line DL3 extended in the second direction DR2.

In some example embodiments of the present invention, the second and third sub pixels SPXL2 and SPXL3 may be provided in the same form, except for the first rod-shaped LED LD1 of the first sub pixel SPXL1. Accordingly, the descriptions of the second and third sub pixels SPXL2 and SPXL3 will be substituted with the description of the first sub pixel SPXL1.

The first sub pixel SPXL1 may further include a partition wall PW, and first and second contact electrodes CNE1 and CNE2.

The partition wall PW may be provided in plural on the substrate SUB and may be spaced apart from each other. The partition wall PW may have a trapezoid shape including one surface SF1, which is in contact with the substrate SUB, an upper surface SF2 facing the one surface SF1, and two lateral surfaces SF3 connecting the one surface SF1 and the upper surface SF2 as illustrated in FIG. 18.

The first reflection electrode REL1 may be disposed on the partition wall PW. The first reflection electrode REL1 may be disposed so as to correspond to a shape of the partition wall PW. Accordingly, the first reflection electrode REL1 may have a gradient, which is the same as or similar to a gradient of the corresponding partition wall PW.

The first reflection electrode REL1 and the partition wall PW may be formed of different materials. For example, the first reflection electrode REL1 may be formed of a conductive material, and the partition wall PW may be formed of an insulating material. Here, the second reflection electrode REL2 may include the same material as that of the first reflection electrode REL1.

The first reflection electrode REL1 may be connected to the first electrode line SL through a first contact hole CH1 and may receive a voltage applied to the first electrode line SL. The second reflection electrode REL2 may be extended from the second-one electrode line DL1 and connected to the second-one electrode line DL1, and may receive a voltage applied to the second-one electrode line DL1. Accordingly, an electric field may be formed between the first reflection electrode REL1 and the second reflection electrode REL2.

When viewed on a plane, the first reflection electrode REL1 connected to the first electrode line SL may be branched to a left side and a right side of the second reflection electrode REL2. Accordingly, the branched first reflection electrodes REL1s and the second reflection electrode REL2 may be alternately disposed on the substrate SUB. Particularly, when viewed on a plane, the second reflection electrode REL2 may be disposed between the branched first reflection electrodes REL1s. In this case, an electric field may be formed between the first reflection electrode REL1 branched to the left side of the second reflection electrode REL2 and the second reflection electrode REL2. Further, an electric field may be formed between the first reflection electrode REL1 branched to the right side of the second reflection electrode REL2 and the second reflection electrode REL2. For convenience of the description, hereinafter, the first reflection electrode REL1 branched to the left side of the second reflection electrode REL2 will be referred to as the first-one reflection electrode REL1, and the first reflection electrode REL1 branched to the right side of the second reflection electrode REL2 will be referred to as the first-two reflection electrode REL1.

The first rod-shaped LED LD1 may be provided between the first and second reflection electrodes REL1 and REL2 on the substrate SUB. Particularly, the first rod-shaped LED LD1 may be provided between the first-one reflection electrode REL1 and the second reflection electrode REL2, and between the second reflection electrode REL2 and the first-two reflection electrode REL1. For convenience of the description, the first rod-shaped LED LD1 provided between the first-one reflection electrode REL1 and the second reflection electrode REL2 will be referred to as the first-one rod-shaped LED LD1, and the first rod-shaped LED LD1 provided between the second reflection electrode REL2 and the first-two reflection electrode REL1 will be referred to as the first-two rod-shaped LED LD1. Self-aligning of the first rod-shaped LED LD1 may be induced by the electric field formed between the first-one and second reflection electrodes REL1 and REL2. Self-aligning of the first-two rod-shaped LED LD1 may be induced by the electric field formed between the first-two and second reflection electrodes REL1 and REL2. Here, both end portions EP1 and EP2 of the first-two rod-shaped LED LD1 may be disposed to be opposite to both end portions EP1 and EP2 of the first-one rod-shaped LED LD1. That is, the second end portion EP2 of the first-one rod-shaped LED LD1 and the second end portion EP2 of the first-two rod-shaped LED LD1 may be disposed while facing each other on the substrate SUB.

The first contact electrode CNE1 for electrically and/or physically connecting the first end portion EP1 of the first-one rod-shaped LED LD1 and the first-one reflection electrode REL1 may be disposed on the first-one reflection electrode REL1. Further, the first contact electrode CNE1 for electrically and/or physically stably connecting the first-two reflection electrode REL1 and the first end portion EP1 of the first-two rod-shaped LED LD1 may be disposed on the first-two reflection electrode REL1. When viewed on a plane, the first contact electrodes CNE1s may cover the first-one and first-two reflection electrodes REL1s, respectively, and overlap the first-one and first-two reflection electrodes REL1, respectively. Further, the first contact electrode CNE1 may overlap the first end portion EP1 of each of the first-one and first-two rod-shaped LEDs LD1s.

The second contact electrode CNE2 for electrically and/or physically stably connecting the second reflection electrode REL2 and the second end portion EP2 of each of the first-one and first-two rod-shaped LEDs LD1s may be disposed on the second reflection electrode REL2. When viewed on a plane, the second contact electrode CNE2 may cover the second reflection electrode REL2 and overlap the second reflection electrode REL2. Further, the second contact electrode CNE2 may overlap the second end portion EP2 of each of the first-one and first-two rod-shaped LEDs LD1s.

Hereinafter, a structure of the light emitting device according to some example embodiments of the present invention will be described according to a lamination sequence with reference to FIGS. 17 and 18.

A buffer layer BFL may be provided on the substrate SUB. The buffer layer BFL may prevent impurities from being diffused from the substrate SUB, and may improve the degree of flatness of the substrate SUB. The buffer layer BFL may be provided of a single layer, but may also be provided of multiple layers including two or more layers. The buffer layer BFL may be an inorganic insulating layer formed of an inorganic material.

A semiconductor pattern SA included in each of the first and second transistors T1 and T2 may be provided on the buffer layer BFL. The semiconductor pattern SA may include a source region, a drain region, and a channel region provided between the source region and the drain region.

A gate insulating layer GI may be provided on the substrate SUB, on which the semiconductor pattern SA is provided.

A gate electrode GE included in each of the first and second transistors T1 and T2 may be disposed on the gate insulating layer GI. Further, the first electrode line SL may be disposed on the gate insulating layer GI. Here, the gate electrode GE may be connected to a scan line, to which a scan signal is applied.

First and second interlayer insulating layers ILD1 and ILD2 may be provided on the substrate SUB, on which the gate electrode GE and the like are provided.

First and second electrodes EL1 and EL2 included in each of the first and second transistors T1 and T2 may be disposed on the second interlayer insulating layer ILD2. Further, a bridge pattern BRP may be disposed on the second interlayer insulating layer ILD2.

The first and second electrodes EL1 and EL2 are different electrodes, and for example, when the first electrode EL1 is a drain electrode, the second electrode EL2 may be a source electrode. In this case, the first electrode EL1 of the second transistor T2 may be connected to the second reflection electrode REL2.

The bridge pattern BRP may be connected to the first electrode line SL through the first contact hole CH1, which sequentially passes through the first and second interlayer insulating layers ILD1 and ILD2.

An insulating layer INS may be provided on the substrate SUB, on which the bridge pattern BRP and the like are provided. The insulating layer INS may be an organic insulating material including an organic material.

The partition walls PWs may be provided on the insulating layer INS. The partition walls PWs may be disposed while being spaced apart from one another by an interval (e.g., a predetermined interval) on the insulating layer INS. Further, a pixel defining layer PDL defining the unit emission area of the light emitting device may be provided on the insulating layer INS. The pixel defining layer PDL and the partition wall PW may be formed of the same insulating material and may be provided on the same layer.

The first-one and first-two reflection electrodes REL1 and the second reflection electrode REL2 may be disposed on the substrate SUB, on which the partition walls PWs are provided. Accordingly, the first-one and first-two reflection electrodes REL1 and the second reflection electrode REL2 may be disposed on the substrate SUB while being spaced apart from one another by an interval (e.g., a predetermined interval). For example, when viewed on a plane, the second reflection electrode REL2 may be disposed between the first-one reflection electrode REL1 and the first-two reflection electrode REL1.

Here, the first-one reflection electrode REL1 may be connected to the bridge pattern BRP through the second contact hole CH2 passing through the insulating layer INS. Accordingly, the first-one reflection electrode REL1 may be connected to the first electrode line SL1 through the bridge pattern BRP and the first and second contact holes CH1 and CH2. Accordingly, the voltage applied to the first electrode line SL1 may be applied to the first-one reflection electrode REL1. The first-two reflection electrode REL1 is branched from the first-one reflection electrode REL1, so that the voltage applied to the first electrode line SL1 may also be applied to the first-two reflection electrode REL1.

The second reflection electrode REL2 may be connected to the first electrode EL1 of the second transistor T2 through an opening of the insulating layer INS, which exposes the first electrode EL1 of the second transistor T2. Further, the second reflection electrode REL2 may be extended from the second-one electrode line DL1 to be connected to the second-one electrode line DL1. Finally, the voltage applied to the first electrode EL1 of the second transistor T2 may be applied to the second-one electrode line DL1 and the second reflection electrode REL2.

The first-one rod-shaped LED LD1 may be aligned between the first-one reflection electrode REL1 and the second reflection electrode REL2. Further, the first-two rod-shaped LED LD1 may be aligned between the first-two reflection electrode REL1 and the second reflection electrode REL2.

A first passivation layer PSV1 covering a part of an upper surface of each of the first-one and first-two rod-shaped LEDs LD1s may be provided on the first-one and first-two rod-shaped LEDs LD1s. Accordingly, the first and second end portions EP1 and EP2 of each of the first-one and first-two rod-shaped LEDs LD1s may be exposed to the outside.

The first contact electrode CNE1 may be disposed on the substrate SUB, on which the first passivation layer PSV1 is provided. The first contact electrode CNE1 may cover the first-one reflection electrode REL1 and the first-two reflection electrode REL1 and may be connected to the corresponding first reflection electrode REL1. Further, the first contact electrode CNE1 may cover the first end portion EP1 of each of the first-one and first-two rod-shaped LEDs LD1s. The first contact electrode CNE1 may electrically and/or physically connect the first-one reflection electrode REL1 and the first end portion EP1 of the first-one rod-shaped LED LD1. Further, the first contact electrode CNE1 may electrically and/or physically connect the first-two reflection electrode REL1 and the first end portion EP1 of the first-two rod-shaped LED LD1.

A second passivation layer PSV2 may be provided on the substrate SUB, on which the first contact electrode CNE1 is provided.

The second contact electrode CNE2 may be disposed on the substrate SUB, on which the second passivation layer PSV2 is provided. The second contact electrode CNE2 may cover the second reflection electrode REL2 and may be connected to the second reflection electrode REL2. Further, the second contact electrode CNE2 may cover the second end portion EP2 of each of the first-one and first-two rod-shaped LEDs LD1s. The second contact electrode CNE2 may electrically and/or physically connect one side of the second reflection electrode REL2 and the second end portion EP1 of the first-one rod-shaped LED LD1. Further, the second contact electrode CNE2 may electrically and/or physically connect the other side of the second reflection electrode REL2 and the second end portion EP2 of the first-two rod-shaped LED LD1.

A third passivation layer PSV3 may be provided on the substrate SUB, on which the second contact electrode CNE2 is provided. The third passivation layer PSV3 may cover the second passivation layer PSV2 and the second contact electrode CNE2 for preventing oxygen and moisture from permeating into the first rod-shaped LED LD1.

As described above, in the light emitting device according to some example embodiments of the present invention, it is possible to easily adjust heights and gradients of the first-one and first-two reflection electrodes REL1 by disposing the partition wall PW under the first-one and first-two reflection electrodes REL1 and adjusting a height and a gradient of the partition wall PW. Accordingly, front light emission efficiency of the first-one and first-two rod-shaped LEDs LD1s may be improved.

Further, in the light emitting device according to some example embodiments of the present invention, the first-one and first-two rod-shaped LEDs LD1s may be aligned in a desired direction by easily adjusting the heights and the gradients of the first-one and first-two reflection electrodes REL1. Accordingly, the aligning defect of the first-one and first-two rod-shaped LEDs LD1s may be minimized.

FIGS. 19 to 27 are cross-sectional views sequentially illustrating a method of manufacturing the light emitting device illustrated in FIG. 18.

Figure 19:
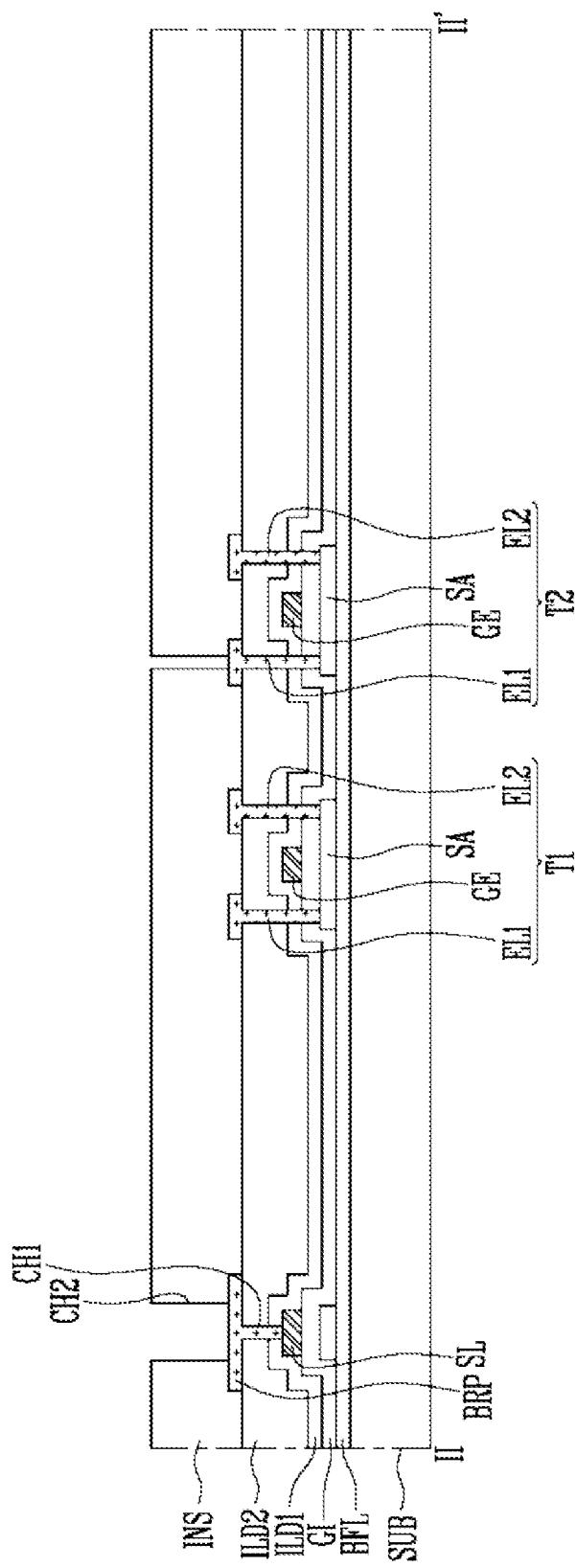
FIGS. 19 to 27 are cross-sectional views sequentially illustrating a method of manufacturing the light emitting device illustrated in FIG. 18.

Referring to FIGS. 18 and 19, first and second transistors T1 and T2 and a bridge pattern BRP may be formed on a substrate SUB. An insulating layer INS including a second contact hole CH2 exposing a part of the bridge pattern BRP and an opening exposing a part of a first electrode of the second transistor T2 may be formed on the first and second transistors T1 and T2 and the bridge pattern BRP.

Figure 20:
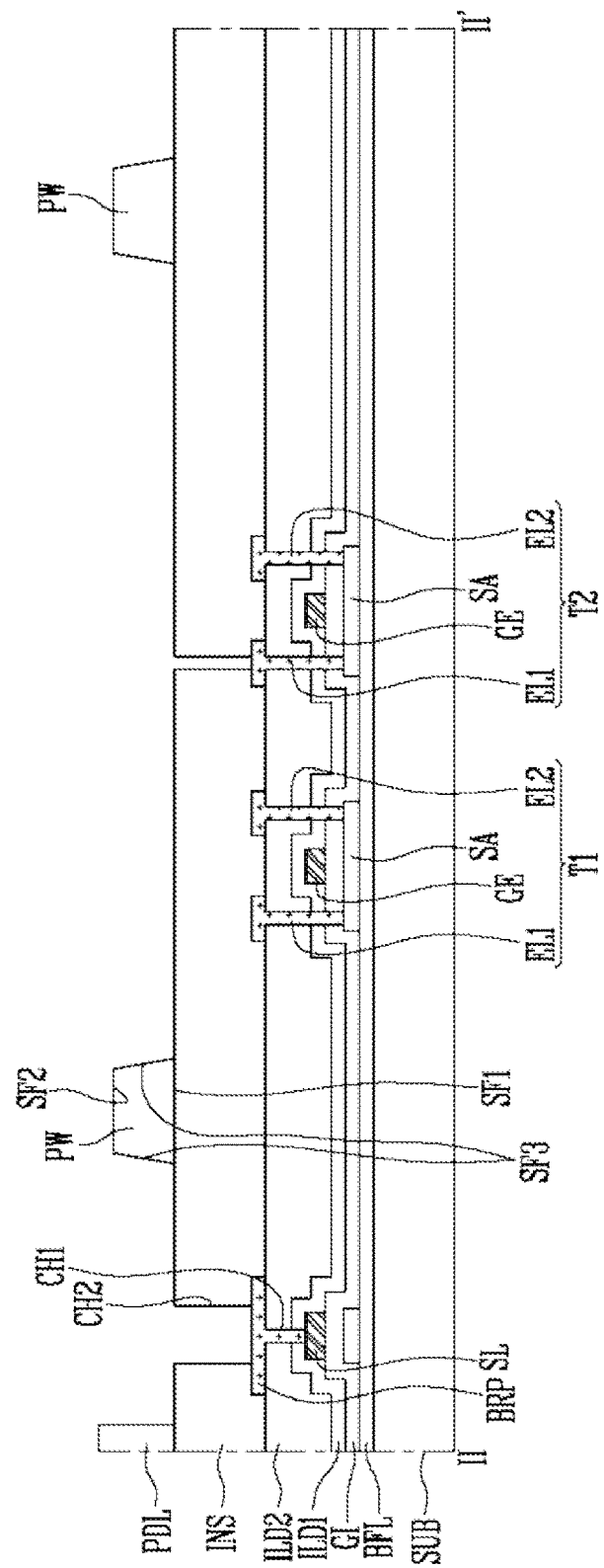

Referring to FIGS. 18 and 20, partition walls PWs and a pixel defining layer PDL may be formed on the substrate SUB, on which the bridge pattern BRP and the like are formed. The partition wall PW and the pixel defining layer PDL may be spaced apart from each other on the substrate SUB by an interval (e.g., a predetermined interval). The partition wall PW may have a trapezoid shape including one surface SF1, which is in contact with the substrate SUB, an upper surface SF2 facing the one surface SF1, and two lateral surfaces SF3 connecting the one surface SF1 and the upper surface SF2, and the number of partition walls PW provided is two or more.

Figure 21:
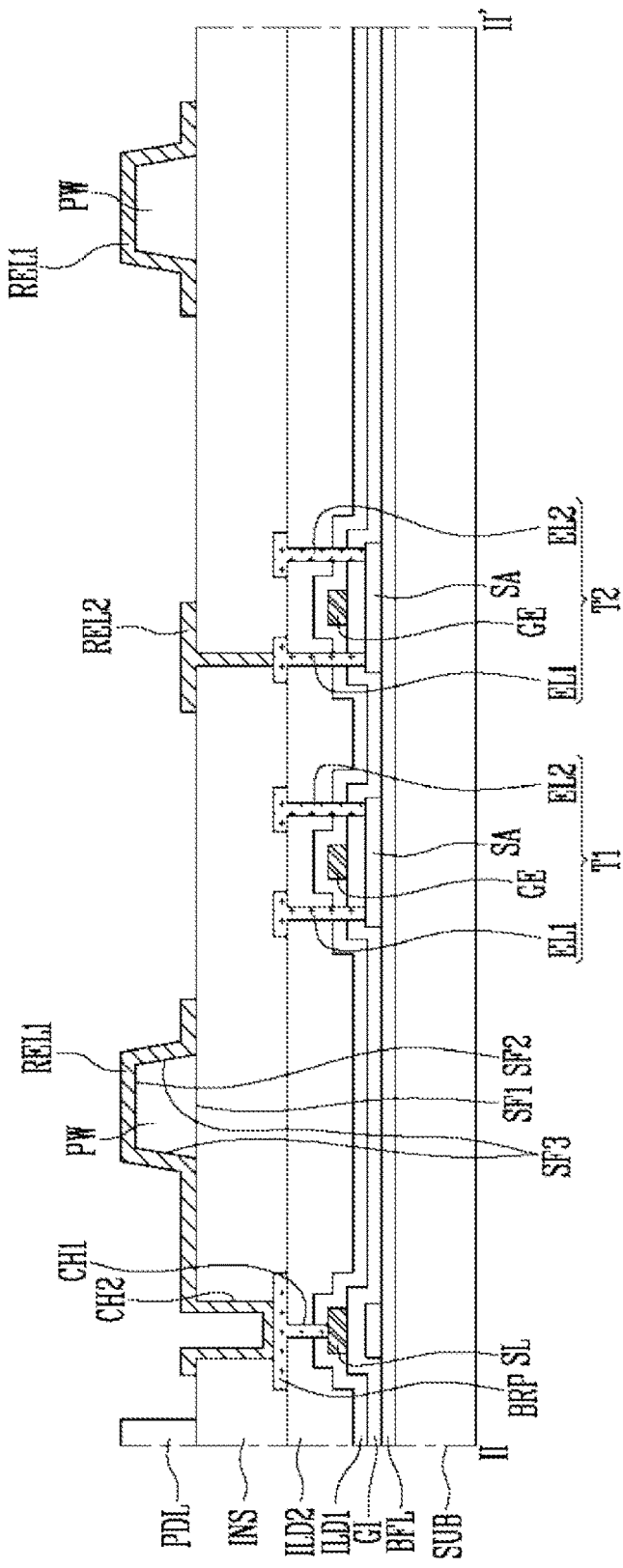

Referring to FIGS. 18 and 21, first and second reflection electrodes REL1 and REL2 may be formed on the substrate SUB, on which the partition walls PWs and the like are formed. The first reflection electrode REL1 may be formed on the partition wall PW and may be connected to the bridge pattern BRP through a second contact hole CH2. The second reflection electrode REL2 may be connected to a first electrode EL1 of the second transistor T2 through the opening of the insulating layer INS. The first reflection electrode REL1 may be branched and disposed at a left side and a right side of the second reflection electrode REL2 as illustrated in FIG. 17. The first reflection electrode REL1 may have an inclination corresponding to a gradient of the partition wall PW.

Figure 22:
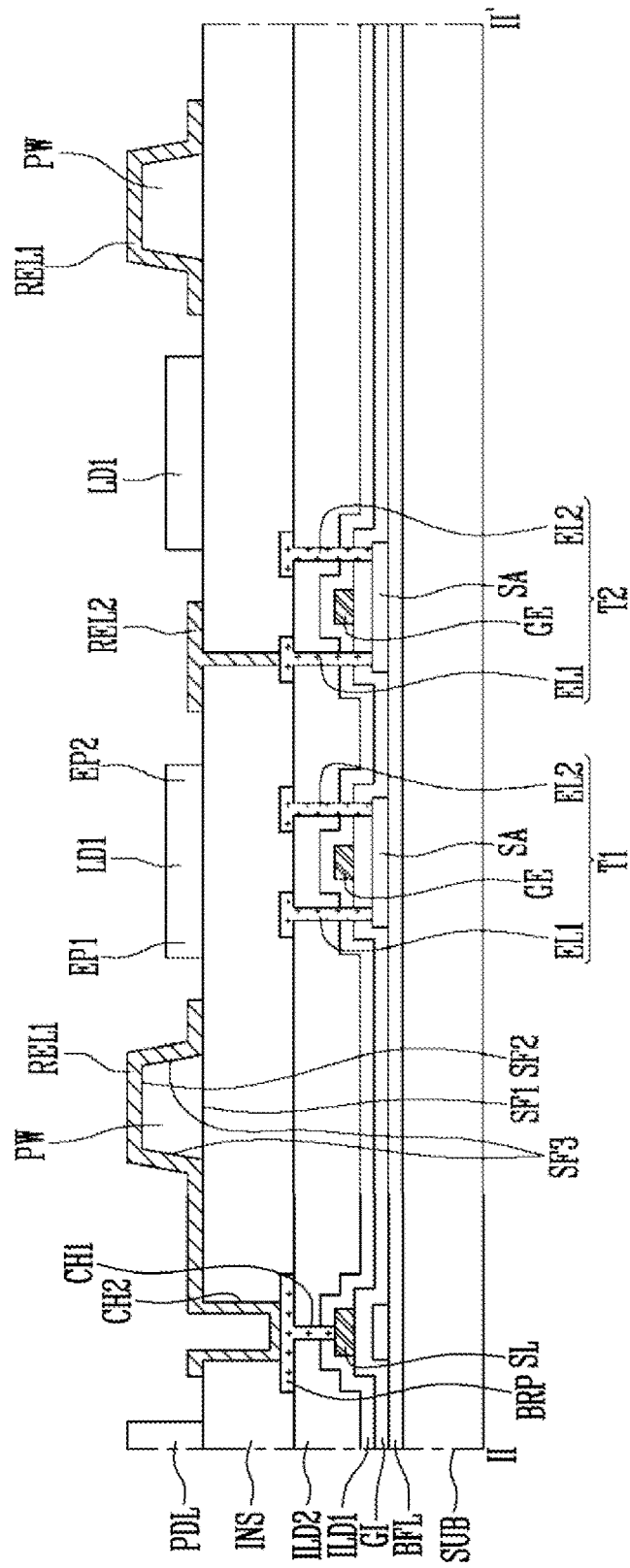

Referring to FIGS. 18 and 22, a first rod-shaped LED LD1 may be aligned on the substrate SUB, on which the first and second reflection electrodes REL1 and REL2 are provided. The first rod-shaped LED LD1 may be aligned between the first reflection electrode REL1, which is disposed at the left side of the second reflection electrode REL2, and the second reflection electrode REL2. Further, the first rod-shaped LED LD1 may be aligned between the first reflection electrode REL1, which is disposed at the right side of the second reflection electrode REL2, and the second reflection electrode REL2.

Figure 23:
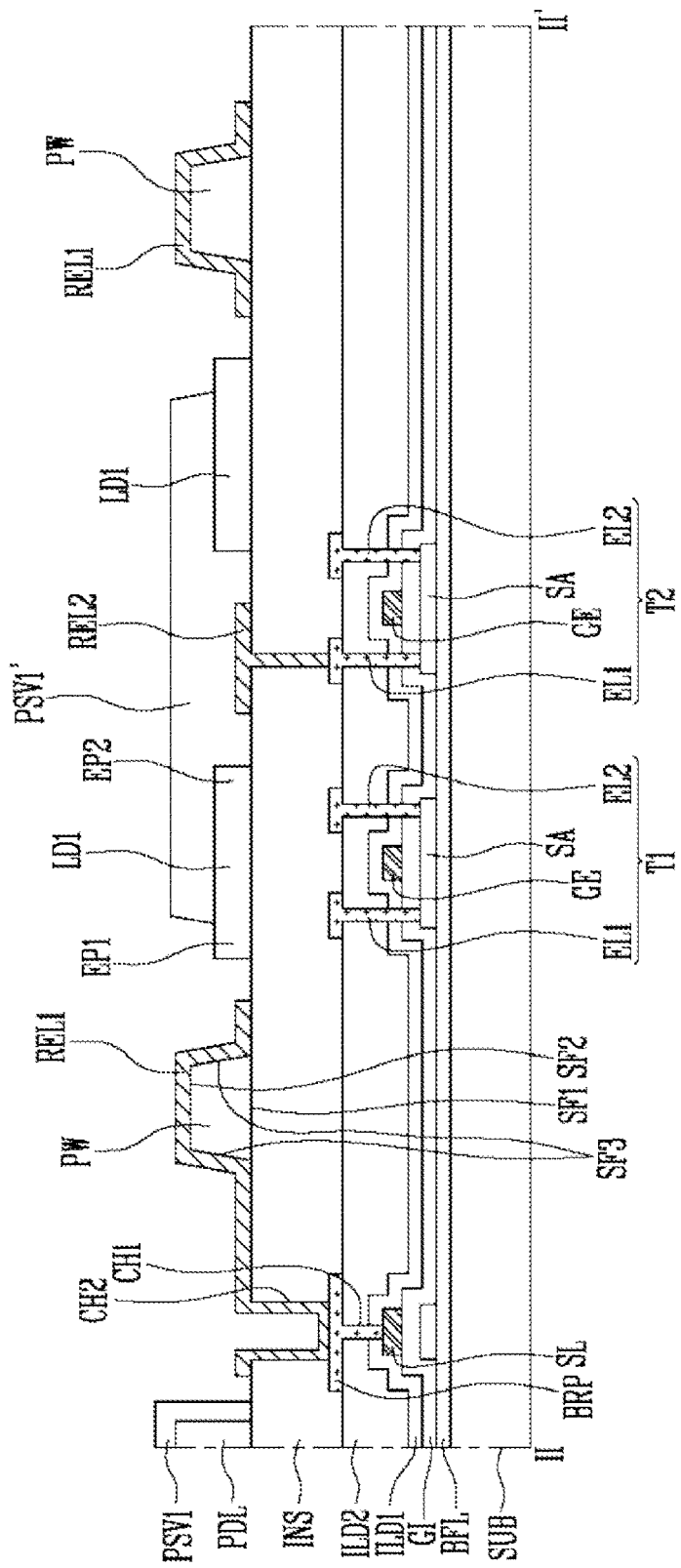

Referring to FIGS. 18 and 23, an insulating material layer is applied onto a front surface of the substrate SUB, to which the first rod-shaped LED LD1 is provided, and then an insulating pattern PSV1' covering a second end portion EP2 and an upper surface of the first rod-shaped LED LD1 and the pixel defining layer PDL may be formed by using a mask process and the like. Here, the first end portion EP1 of the first rod-shaped LED LD1 may be exposed to the outside.

Figure 24:
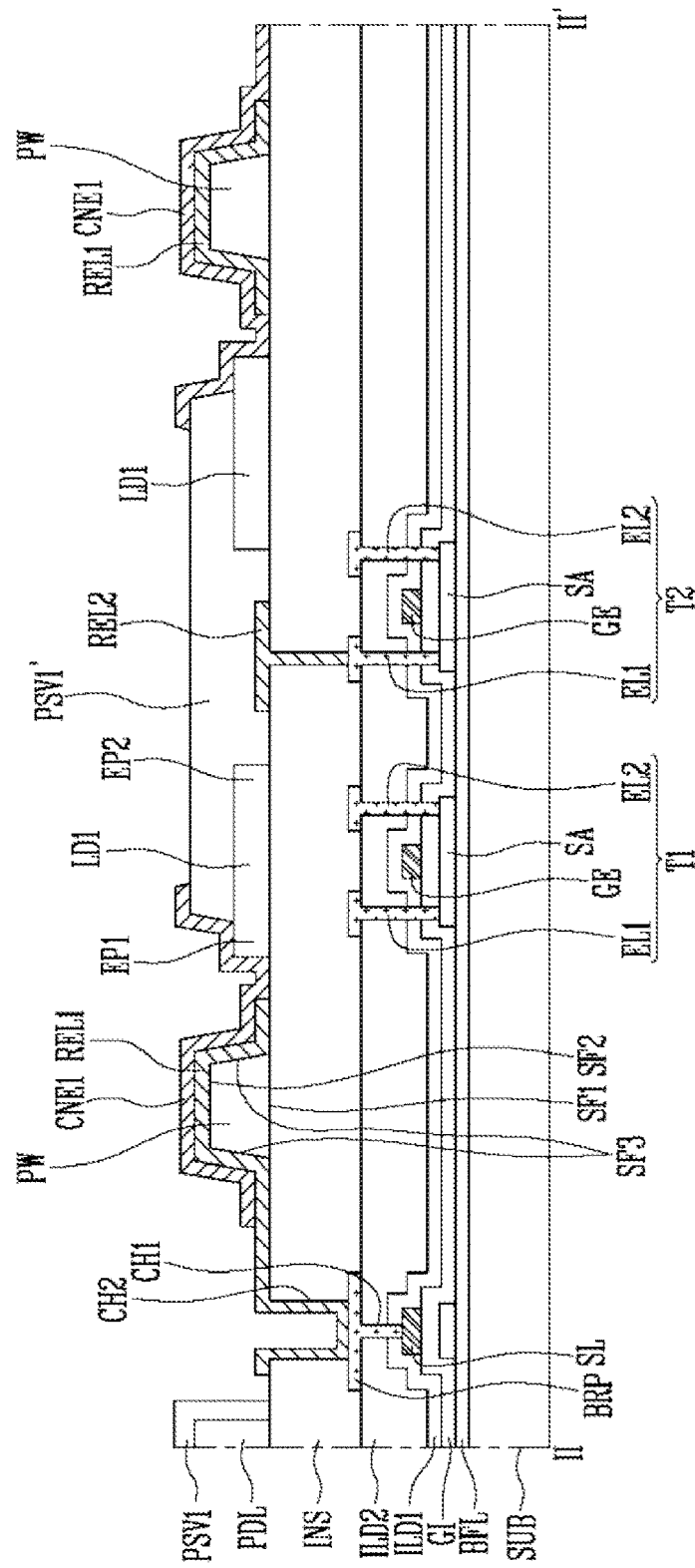

Referring to FIGS. 18 and 24, a first contact electrode CNE1 may be formed on the substrate SUB, on which the insulating pattern PSV1' is formed. The first contact electrode CNE1 may cover the first reflection electrode REL1 and may be connected to the first reflection electrode REL1. Further, the first contact electrode CNE1 may cover the first end portion EP1 of the first-rod-shaped LED LD1. The first contact electrode CNE1 may electrically and/or physically connect the first reflection electrode REL1 and the first end portion EP1 of the first-rod-shaped LED LD1.

Figure 25:
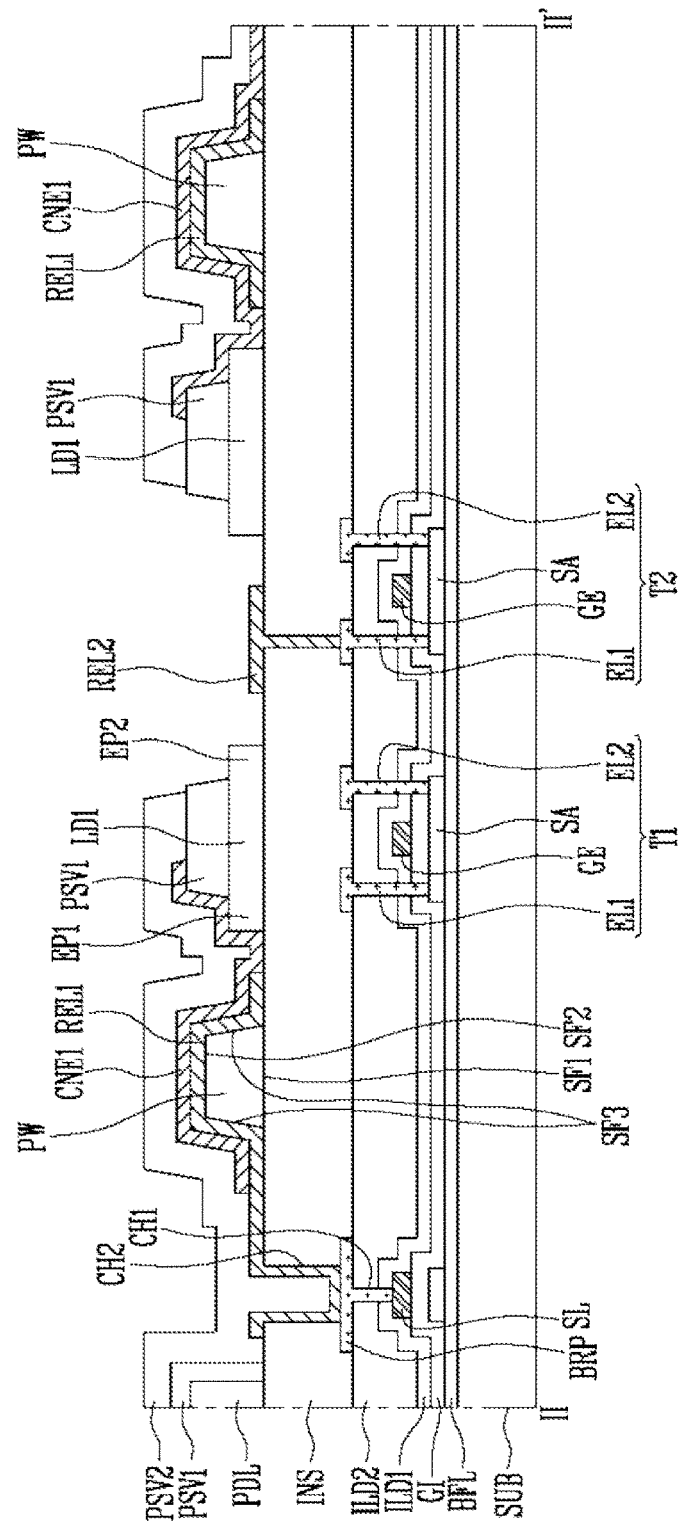

Referring to FIGS. 18 and 25, an insulating material layer is applied on to the front surface of the substrate SUB, on which the first contact electrode CNE1 is formed, and then a second passivation layer PSV2 exposing the second contact electrode CNE2 and the second end portion EP2 of the first rod-shaped LED LD1 may be formed by using a mask process and the like. Here, the insulating pattern PSV1' illustrated in FIG. 24 may be patterned at the same time by the mask process to become the first passivation layer PSV1 exposing the second end portion EP2 of the first rod-shaped LED LD1 and the second reflection electrode REL2.

Figure 26:
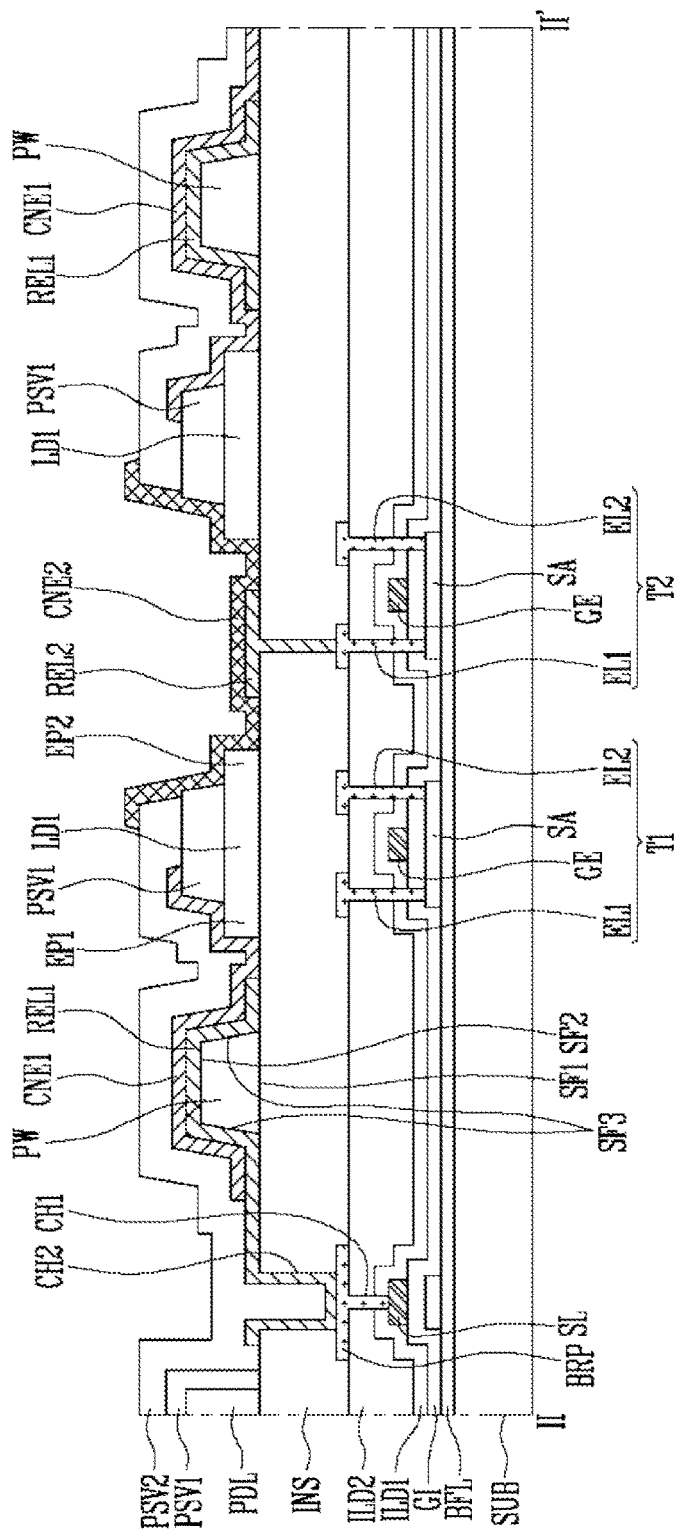

Referring to FIGS. 18 and 26, a second contact electrode CNE2 may be formed on the substrate SUB, on which the second passivation layer PSV2 is formed. The second contact electrode CNE2 may cover the second reflection electrode REL2 and may be connected to the second reflection electrode REL2. Further, the second contact electrode CNE2 may cover the second end portion EP2 of the first rod-shaped LED LD1. The second contact electrode CNE2 may electrically and/or physically connect the second reflection electrode REL2 and the second end portion EP1 of the first rod-shaped LED LD1.

Figure 27:
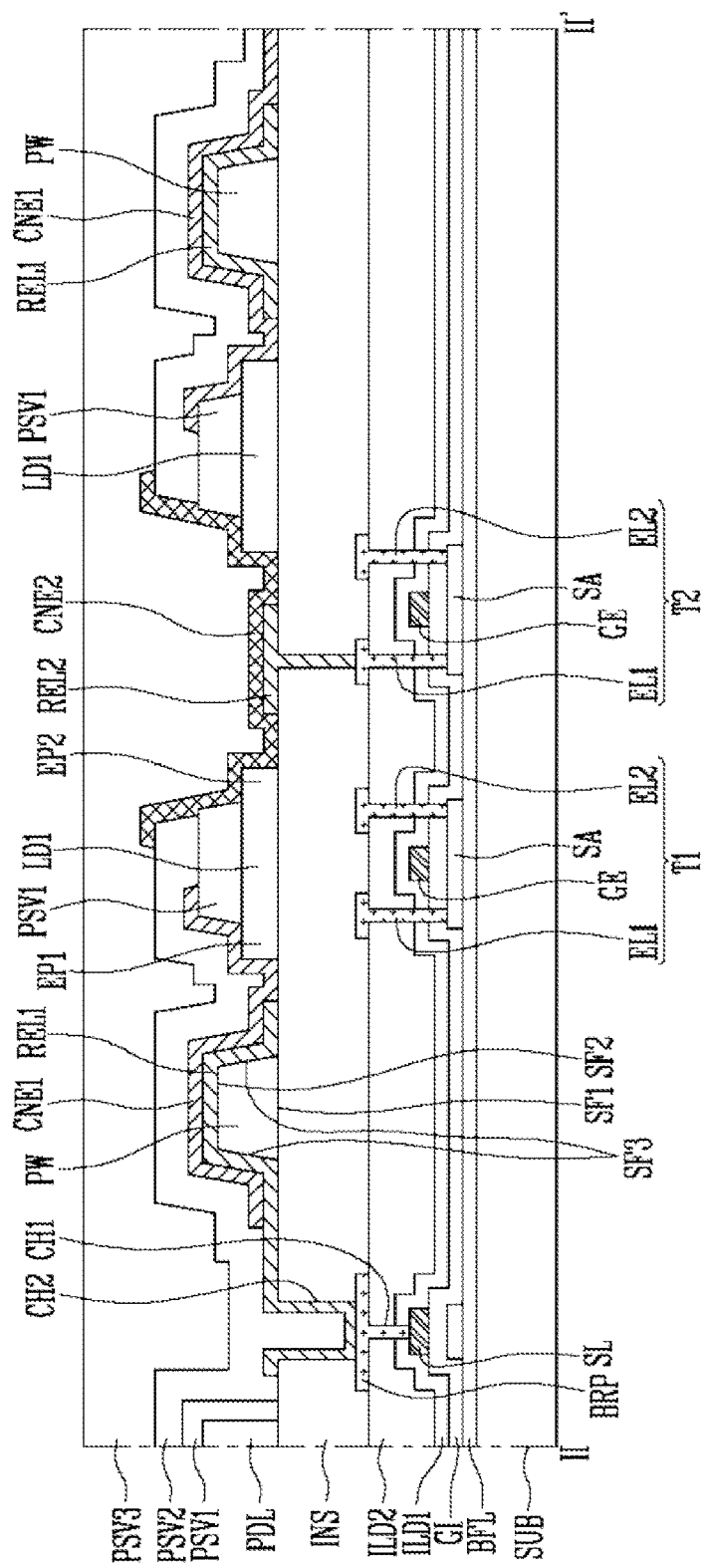

Referring to FIGS. 18 and 27, a third passivation layer PSV3 may be formed on the substrate SUB, on which the second contact electrode CNE2 is provided. The third passivation layer PSV3 may cover the second passivation layer PSV2 and the second contact electrode CNE2 for preventing oxygen and moisture from permeating into the first rod-shaped LED LD1.

The light emitting device according to INR 16 Lakhs may be applied to various display devices. For example, the light emitting device may be applied to a television, a notebook computer, a mobile phone, a smart phone, a smart pad (PD), a Portable Multimedia Player (PDP), a Personal Digital Assistant (PDA), a navigation device, various wearable devices, such as a smart watch, and the like.

Although aspects of some example embodiments of the present invention have been described with reference to some example embodiments, those skilled in the art may understand that the present disclosure may be variously modified and changed within a scope without departing from the spirit and the area of the present disclosure described in the accompanying claims and their equivalents.

Accordingly, the technical scope of the present invention is not limited to the contents described in the detailed description of the specification, but shall be defined by the claims and their equivalents.

What is claimed is:

1. A light emitting device, comprising:
   a substrate;
   a light emitting element on the substrate, the light emitting element having a first end portion and a second end portion arranged in a longitudinal direction;
   one or more partition walls disposed on the substrate, the one or more partition walls being spaced apart from the light emitting element;
   a first reflection electrode adjacent the first end portion of the light emitting element;
   a second reflection electrode adjacent the second end portion of the light emitting element;
   a first contact electrode directly connected to the first reflection electrode and the first end portion of the light emitting element;
   an insulating layer on the first contact electrode, the insulating layer having an opening exposing the second end portion of the light emitting element and the second reflection electrode to the outside; and
   a second contact electrode on the insulating layer, the second contact electrode being connected to the second reflection electrode and the second end portion of the light emitting element through the opening.

2. The light emitting device of claim 1, wherein any one of the first and second reflection electrodes is on the partition wall.

3. The light emitting device of claim 2, wherein the first and second reflection electrodes and the partition wall comprise different materials.

4. The light emitting device of claim 3, wherein the partition wall includes an insulating material and the first and second reflection electrodes include a conductive material.

5. The light emitting device of claim 1, wherein when viewed on a plane, the first contact electrode overlaps the first reflection electrode, and the second contact electrode overlaps the second reflection electrode.

6. The light emitting device of claim 1, wherein the light emitting element is a light emitting diode shaped like a cylinder or a polyprism having a micro scale or a nano scale.

7. The light emitting device of claim 6, wherein the light emitting element comprises:
- a first conductive semiconductor layer in which a first conductive dopant is doped;
- a second conductive semiconductor layer in which a second conductive dopant is doped; and
- an active layer disposed between the first and second conductive semiconductor layers.

8. The light emitting device of claim 7, wherein any one of the first and second contact electrodes includes a conductive material, of which a work function is less than 4.1 eV, and the other of the first and second contact electrodes includes a conductive material, of which a work function is larger than 7.5 eV.

9. The light emitting device of claim 1, wherein each of the first and second reflection electrodes is on the partition wall.

10. The light emitting device of claim 1, further comprising:
- a support member between the substrate and the light emitting element.

11. The light emitting device of claim 10, wherein the support member includes an insulating material.

12. The light emitting device of claim 1, further comprising:
- an insulating film on an outer circumferential surface of the light emitting element.

13. A display device, comprising:
- a substrate including a pixel area;
- a pixel in the pixel area and having one or more thin film transistors; and
- a light emitting device on the thin film transistor and connected to the thin film transistor,
wherein the light emitting device comprises:
- a plurality of light emitting elements on the substrate, the plurality of light emitting elements each having a first end portion and a second end portion arranged in a longitudinal direction;
- one or more partition walls spaced apart from each of the plurality of light emitting elements;
- a first reflection electrode adjacent the first end portion of each light emitting element;
- a second reflection electrode adjacent the second end portion of each light emitting element;
- a first contact electrode directly connected to the first reflection electrode and the first end portion;
- an insulating layer on the first contact electrode, and having an opening exposing the second end portion and the second reflection electrode to the outside; and
- a second contact electrode on the insulating layer and connected to the second reflection electrode and the second end portion through the opening, and
any one of the first and second reflection electrodes is connected to the thin film transistor.

14. The display device of claim 13, wherein any one of the first and second reflection electrodes is on the partition wall.

15. The display device of claim 14, wherein the first and second reflection electrodes and the partition wall include different materials.

16. The display device of claim 15, wherein the partition wall includes an insulating material and the first and second reflection electrodes include a conductive material.

17. The display device of claim 13, wherein when viewed on a plane, the first contact electrode overlaps the first reflection electrode, and the second contact electrode overlaps the second reflection electrode.

18. The display device of claim 13, wherein each of the plurality of light emitting elements is a light emitting diode shaped like a cylinder or a polyprism having a micro scale or a nano scale.

19. The display device of claim 13, wherein any one of the first and second contact electrodes includes a conductive material, of which a work function is less than 4.1 eV, and the other of the first and second contact electrodes includes a conductive material, of which a work function is larger than 7.5 eV.

20. The display device of claim 13, wherein each of the first and second reflection electrodes is on the partition wall.

* * * * *